(12) United States Patent
Tokiwa et al.

(10) Patent No.: US 7,577,030 B2
(45) Date of Patent: Aug. 18, 2009

(54) SEMICONDUCTOR STORAGE DEVICE

(75) Inventors: Naoya Tokiwa, Fujisawa (JP); Norihiro Fujita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 12/015,755

(22) Filed: Jan. 17, 2008

(65) Prior Publication Data

US 2008/0170435 A1     Jul. 17, 2008

(30) Foreign Application Priority Data

Jan. 17, 2007  (JP)  ............................. 2007-007856
Jan. 16, 2008  (JP)  ............................. 2008-006688

(51) Int. Cl.
    *G11C 11/34*  (2006.01)
(52) U.S. Cl. .............................. 365/185.03; 365/185.22
(58) Field of Classification Search ............ 365/185.03, 365/185.22, 185.2
    See application file for complete search history.

(56) References Cited

U.S. PATENT DOCUMENTS

| | | | |
|---|---|---|---|
| 6,856,546 B2* | 2/2005 | Guterman et al. | 365/185.2 |
| 7,184,348 B2* | 2/2007 | Crippa et al. | 365/207 |
| 7,457,164 B2* | 11/2008 | Ohta | 365/185.22 |
| 2004/0062099 A1 | 4/2004 | Hosono et al. | |
| 2004/0170056 A1 | 9/2004 | Shibata et al. | |
| 2006/0117214 A1 | 6/2006 | Sugiura et al. | |
| 2007/0297236 A1 | 12/2007 | Tokiwa | |

* cited by examiner

*Primary Examiner*—Anh Phung
(74) *Attorney, Agent, or Firm*—Oblon, Spivak, McClelland, Maier & Neustadt, P.C.

(57) ABSTRACT

A memory cell array has a plurality of multi-value memory cells arranged therein that can store information of two bits or more in one memory cell as a different page. In each of the data registers, an acceptable number setting register, which temporarily retains data read from the memory cell array, stores multiple acceptable numbers of data states corresponding to each state of threshold voltages of each of the pages in the multi-value memory cells. A selector selects, from the multiple acceptable numbers of data states, an acceptable number of data states for data retained in each of the data registers corresponding to each page of the multi-value memory cells. A comparator compares the number of data states retained in each of the data registers with the acceptable number of data states selected by the selector.

20 Claims, 25 Drawing Sheets

| pvfyU3 | pvfyU2 | pvfyU1 | UPPER | BSPF |
|--------|--------|--------|-------|------|
| * | * | * | 0 | BSPF_L |
| 0 | 0 | 1 | 1 | BSPF_U1 |
| 0 | 1 | 0 | 1 | BSPF_U2 |
| 1 | 0 | 0 | 1 | BSPF_U3 |

| pvfyU3 | pvfyU2 | pvfyU1 | UPPER | BSPF |
|---|---|---|---|---|
| * | * | * | 0 | BSPF_L |
| 0 | 0 | 1 | 1 | BSPF_U1 |
| 0 | 1 | 0 | 1 | 0 |
| 1 | 0 | 0 | 1 | BSPF_U3 |

| pvfyU3 | pvfyU2 | pvfyU1 | UPPER | BSPF |
|---|---|---|---|---|
| * | * | * | 0 | BSPF_L |
| 0 | 0 | 1 | 1 | {1'b0, BSPF_U1} |
| 0 | 1 | 0 | 1 | 0 |
| 1 | 0 | 0 | 1 | {1'b0, BSPF_U1} |

FIG. 21

| pvfy3U | pvfy3L | pvfy2U | pvfy2L | pvfy1U | pvfy1L | pvfy0U | MIDDLE | UPPER | BSPF |
|---|---|---|---|---|---|---|---|---|---|
| * | * | * | * | * | * | * | 0 | 0 | BSPF_L |
| * | * | * | * | 0 | 0 | 1 | 1 | 0 | BSPF_M1 |
| * | * | * | * | 0 | 1 | 0 | 1 | 0 | BSPF_M2 |
| * | * | * | * | 1 | 0 | 0 | 1 | 0 | BSPF_M3 |
| 0 | 0 | 0 | 0 | 0 | 1 | 1 | 0 | 1 | BSPF_U1 |
| 0 | 0 | 0 | 0 | 1 | 0 | 0 | 0 | 1 | BSPF_U2 |
| 0 | 0 | 0 | 1 | 0 | 0 | 0 | 0 | 1 | BSPF_U3 |
| 0 | 0 | 1 | 0 | 0 | 0 | 0 | 0 | 1 | BSPF_U4 |
| 0 | 1 | 0 | 0 | 0 | 0 | 0 | 0 | 1 | BSPF_U5 |
| 1 | 0 | 0 | 0 | 0 | 0 | 0 | 0 | 1 | BSPF_U6 |
| 0 | 0 | 0 | 0 | 0 | 0 | 0 | 0 | 1 | BSPF_U7 |

FIG. 23

| pvfy3U | pvfy3L | pvfy2U | pvfy2L | pvfy1U | pvfy1L | pvfy0U | MIDDLE | UPPER | BSPF |
|---|---|---|---|---|---|---|---|---|---|
| * | * | * | * | * | * | * | 0 | 0 | BSPF_L |
| * | * | * | * | 0 | 0 | 1 | 1 | 0 | BSPF_M1 |
| * | * | * | * | 0 | 1 | 0 | 1 | 0 | 0 |
| * | * | * | 0 | 1 | 0 | 0 | 1 | 0 | BSPF_M3 |
| 0 | 0 | 0 | 0 | 0 | 0 | 1 | 0 | 1 | BSPF_U1 |
| 0 | 0 | 0 | 0 | 1 | 1 | 0 | 0 | 1 | 0 |
| 0 | 0 | 0 | 1 | 0 | 0 | 0 | 0 | 1 | BSPF_U3 |
| 0 | 0 | 1 | 0 | 0 | 0 | 0 | 0 | 1 | 0 |
| 0 | 1 | 0 | 0 | 0 | 0 | 0 | 0 | 1 | BSPF_U5 |
| 1 | 0 | 0 | 0 | 0 | 0 | 0 | 0 | 1 | BSPF_U7 |

SEMICONDUCTOR STORAGE DEVICE

CROSS REFERENCE TO RELATED APPLICATIONS

This application is based on and claims the benefit of priority from prior Japanese Patent Application No. 2007-7856, filed on Jan. 17, 2007, and 2008-6688, filed on Jan. 16, 2008, the entire contents of which are incorporated herein by reference.

BACKGROUND OF THE INVENTION

1. Field of the Invention

The present invention relates to a semiconductor storage device, and particularly, to a semiconductor storage device with a pseudo-pass function.

2. Description of the Related Art

In NAND-type flash memories of semiconductor storage devices, write speed and erase speed are effectively improved by writing data in one page basis, performing erase operations in plural page basis, and so on. In a write operation in page, write data is first serially input. The write data is then input to a register for one page. After that, a write-pulse application and verify read operations are repeated until the write operations are completed for all data in the page. As such, it is necessary to read data after verify read operations from all registers in the page, which can be time-consuming. In view of the above, Japanese Patent Laid-Open No. 2002-140899 discloses an invention with respect to a method for rapidly detecting not only whether all results of verify read operations are passed, but also the number of fails.

On the other hand, when a NAND-type flash memory of a semiconductor storage device is used, detection and correction of bit errors with ECC (Error Checking and Correcting) is an effective solution to ensure sufficient reliability. For example, a standard system using a multi-value NAND-type flash memory is equipped with ECC that may detect and correct a bit error with four symbols per page.

Meanwhile, recent years have seen significant improvements in integration density and capacity of NAND-type flash memories. However, a phenomenon has been observed in these NAND-type flash memories with such improved integration density and capacity: extemporaneous increase in thresholds in a certain memory cell leads to an incorrect data write or erase operation. Such a phenomenon is referred to as, so-called, "extemporaneous bit flips".

In multi-value NAND-type flash memories, it is believed to be more advantageous, from the viewpoint of cost, to ensure reliability with "extemporaneous bit flips" accepted to some extent. Based on this idea, a "pseudo-pass function" has been developed. The "pseudo-pass function" is a technique that returns "PASS" as a status even if a bit error occurs in one or more bits at the time of completion of a write or erase sequence within a chip. With this technique, if any bit error occurs at the time of completion of a write or erase sequence within the chip, the ECC is performed in a system or flash controller when reading. Therefore, those bit errors pose no problem that include a correctable number of error bits. However, the NAND-type flash memory with the "pseudo-pass function" has a problem that could reduce write or erase speed, possibly leading to degradation in performance of electronics systems using such NAND-type flash memories. In view of the above, Japanese Patent Laid-Open No. 2006-134482 discloses an invention that mitigates such performance degradation.

Further, Japanese Patent Laid-Open No. 2004-192789 discloses an invention of a method for writing data in a semiconductor storage device in order of data units referred to as "pages" (generally, 2 KB+redundant column) and physical write data in a memory cell, in order to improve data reliability associated with refinement.

SUMMARY OF THE INVENTION

A semiconductor storage device according to one aspect of the present invention comprises: a memory cell array with a plurality of multi-value memory cells arranged therein, the plurality of multi-value memory cells capable of storing information of two bits or more in one memory cell as a different page; a plurality of data registers temporarily retaining data read from the memory cell array; an acceptable-number setting register storing multiple acceptable numbers of data states corresponding to each state of threshold voltages of each page in the multi-value memory cells; a selector selecting, from the multiple acceptable numbers of data states, an acceptable number of data states for data retained in each of the data registers corresponding to each page of the multi-value memory cells; and a comparator comparing the number of data states retained in each of the data registers with the acceptable number of data states selected by the selector.

BRIEF DESCRIPTION OF THE DRAWINGS

FIG. 21 is a diagram illustrating a relationship between input signals and register output signals according to the fifth embodiment;

FIG. 23 is a diagram illustrating a relationship between input signals and register output signals according to a sixth embodiment;

DETAILED DESCRIPTION OF THE EMBODIMENTS

First Embodiment

A first embodiment of the present invention will now be described below.

Figure 1:
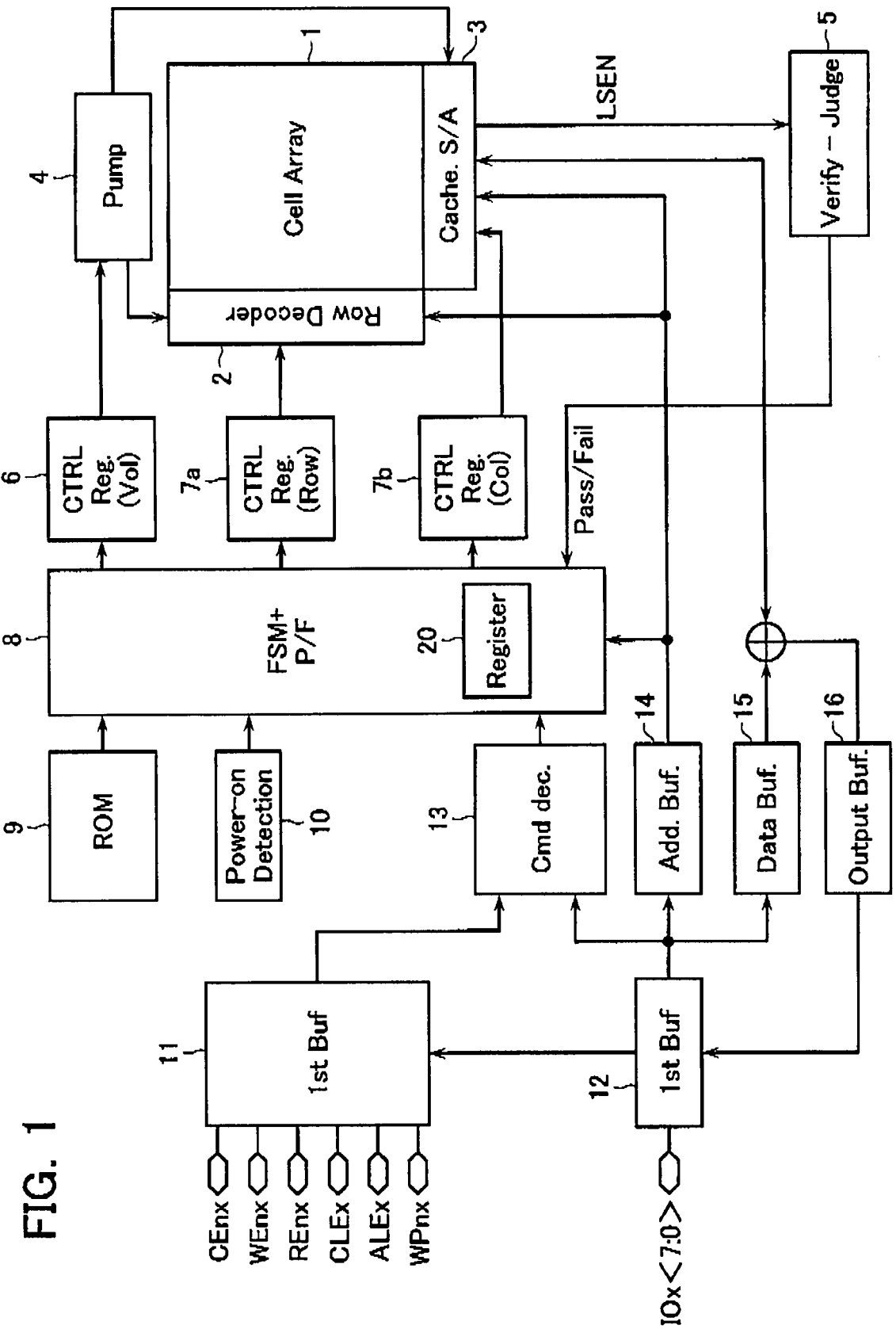
FIG. 1 is block diagram of a flash memory according to embodiments of the present invention.
Figure 2:
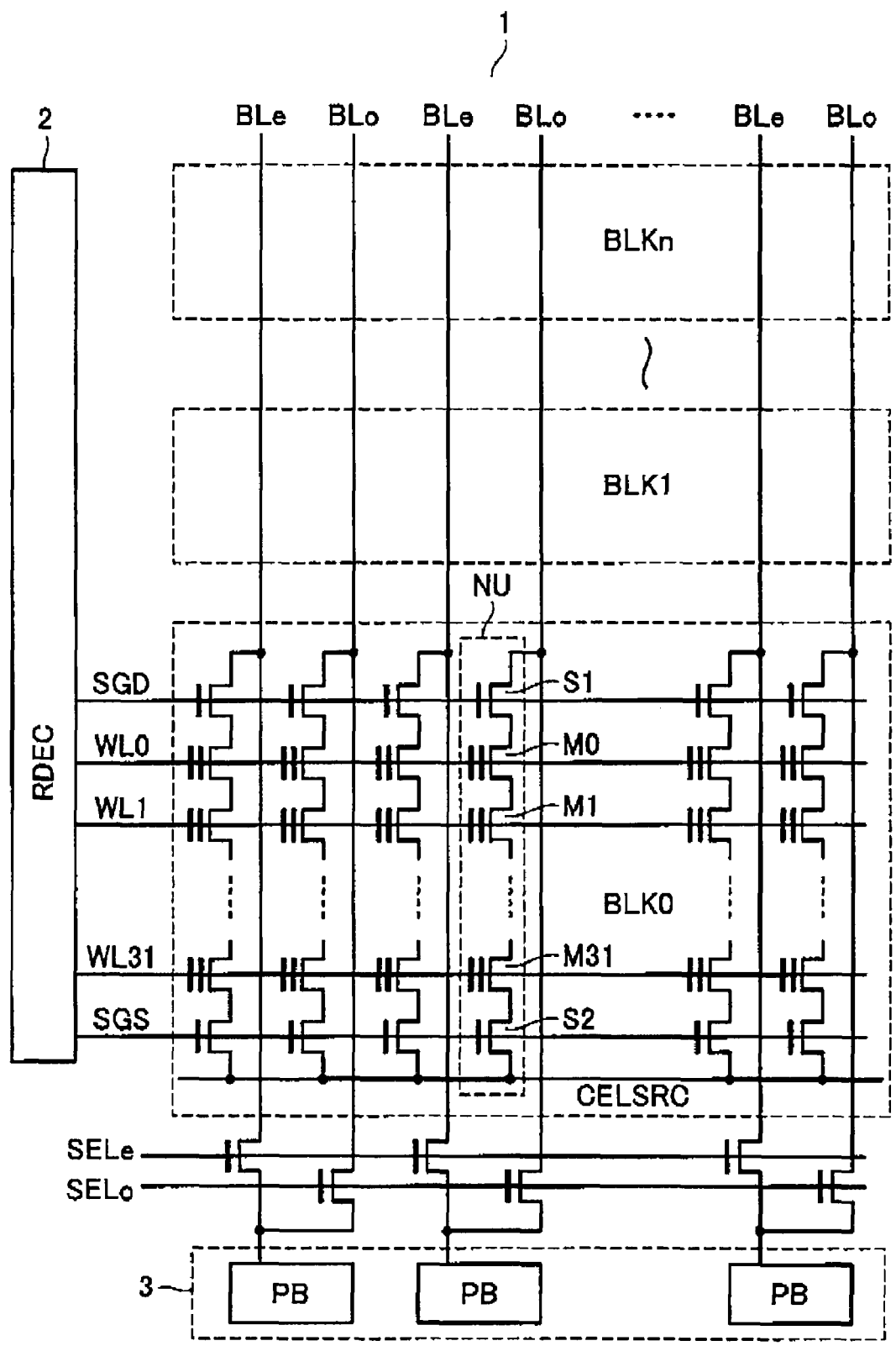
FIG. 2 is a configuration diagram of a memory cell array in the flash memory illustrated in FIG. 1.

FIG. 1 illustrates a functional block configuration for a NAND-type flash memory according to this embodiment; and FIG. 2 illustrates a cell array configuration of the memory core part in the NAND-type flash memory. As illustrated in FIG. 2, a cell array 1 comprises a series of NAND cell units (NAND strings) NU, each having a plurality of electrically rewritable non-volatile memory cells (in this example, 32 memory cells MC) M0-M31 connected in series.

One end of each of the NAND cell units NU is connected to a respective bit line BLo (odd-numbered) and BLe (even-numbered) via a respective selection gate transistor S1, and the other end connected to a common source line CELSRC via a respective selection gate transistor S2. A control gate of each of the memory cells M0-M31 is connected to a respective word line WL0-WL31. The gate of each of the selection gate transistors S1 and S2 is connected to a respective selection gate line SGD and SGS.

A set of NAND cell units arranged in the direction of word lines configure a corresponding block that is used as a minimum unit for erase of data. As illustrated, a plurality of blocks BLK0-BLKn are arranged in the direction of bit lines.

A sense amplifier circuit 3, which is used to read and write cell data, is positioned at one end of each of the bit lines BLe and BLo, while a row decoder 2 for selectively driving word lines and selection gate lines is positioned at one end of each of the word lines. FIG. 2 illustrates an exemplary case where any one of an even-numbered bit line BLe and an odd-numbered bit line Blo that are adjacent to each other is selectively connected to a respective sense amplifier PB in the sense amplifier circuit 3, in response to selection signals SELe and SELo from a bit-line selection circuit. That is, each sense amplifier PB is shared by an even-numbered bit line BLe and an adjacent odd-numbered bit line Blo. This is attributed to the consideration for difficulties in positioning a sensing unit for each bit-line pitch and for a possible increase in capacitance-coupled noise between adjacent bit lines due to the refinement of the cell array 1. The even-numbered bit line BLe and the odd-numbered bit line Blo may reduce the effects of capacitance-coupled noise between bit lines if one is used as a shield line when the other is selected. In this embodiment, a set of memory cells that are selected by one word line and all of the even-numbered bit lines configure a first page (odd-numbered page), while another set of memory cells that are selected by all of the word lines and all of the odd-numbered bit lines configure a second page (odd-numbered page). One page is the unit of data read and write operations that are performed at the same time.

Commands, addresses and data are input via an input buffer 12. External control signals, such as chip-enable signals CEnx, write-enable signals WEnx, or read-enable signals REnx, are input via an input buffer 11. Commands are decoded at a command decoder 13 and sent to a state machine 8, which is an internal control circuit.

Some or all of the control programs of the state machine 8 are retained in a ROM circuit 9. These control programs are transferred to the state machine 8 when a power-on detection circuit 10 detects a power-on at the time of power on, after which operational controls are performed.

Addresses are transferred to a row decoder and a column gate via an address buffer 14 through respective control registers 7a and 7b. Write data is loaded to the sense amplifier circuit 3 via a data buffer 15, and read data of the sense amplifier circuit 3 is output to the outside via a data buffer 16.

A high-voltage generation circuit 4 is provided for generating a high voltage required for the mode of operation. The high-voltage generation circuit 4 generates a predetermined high voltage based on the order provided from the state machine 8 via a control register 6.

A verify-judge circuit 5 is also provided that is attached to the sense amplifier circuit 3 for performing a verify-judge in writing data based on data in a data latch in the sense amplifier circuit 3. The state machine 8 monitors PASS/FAIL flags corresponding to outputs from the verify-judge circuit 5 to control write sequences. In addition, the state machine 8 is provided with a register 20, in which verification flags stated below are stored.

Figure 3:
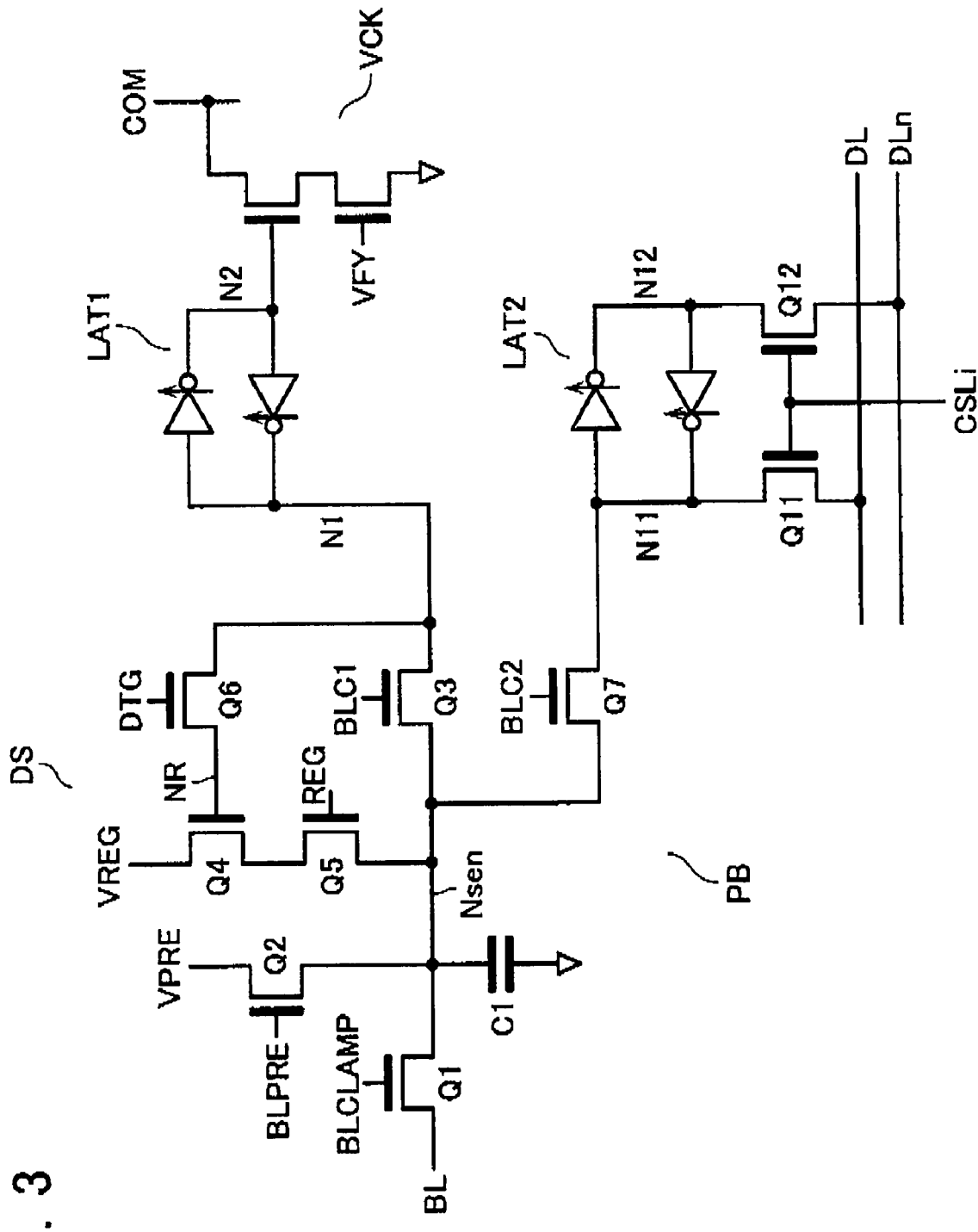
FIG. 3 is a configuration diagram of a sense amplifier in the flash memory illustrated in FIG. 1.

FIG. 3 illustrates an exemplary configuration of one sense amplifier PB in the sense amplifier circuit 3. An NMOS transistor Q1, which is provided between a sense node Nsen and a bit line BL, serves to clamp pre-charged voltages of the bit line BL. The NMOS transistor Q1 also serves as a pre-sense amplifier that amplifies bit-line voltages. The sense node Nsen is connected to a pre-charging NMOS transistor Q2 and, if necessary, to a capacitor C1 for retaining charges.

The sense node Nsen is connected to one data node N1 of a data latch LAT1 via a transferring NMOS transistor Q3. A data storage circuit DS is provided between the data node N1 and the sense node Nsen for temporarily storing read data. The gate of an NMOS transistor Q4, whose drain is connected to a voltage terminal VREG, corresponds to a data storage node NR. A data-transferring NMOS transistor Q6 is positioned between the storage node NR and the data node N1 of the data latch LAT1. An NMOS transistor Q5 is also positioned between the NMOS transistor Q4 and the sense node Nsen for transferring a voltage VREG to the sense node Nsen depending on data retained by the storage node NR.

The data storage circuit DS is used as a write back circuit for retaining write data obtained from previous cycle in writing to write "0" data back to the data latch LAT1 in a verify read operation only for a cell, for which insufficient "0" write operations are performed. In other words, the data latch LAT1 is controlled to be brought into a state of all "1" data upon completion of write operations for all bits in one page.

The data node Nsen is also connected to another data latch LAT2, which configures a data cache via a transferring NMOS transistor Q7. One page of read/write data is transferred at the same time between the data latches LAT1 and LAT2. Data nodes N11 and N12 of the data latch LAT2 are connected to complemental data lines DL and DLn via column selection gates Q11 and Q12 controlled by a column selection signal CSLi.

Figure 4:
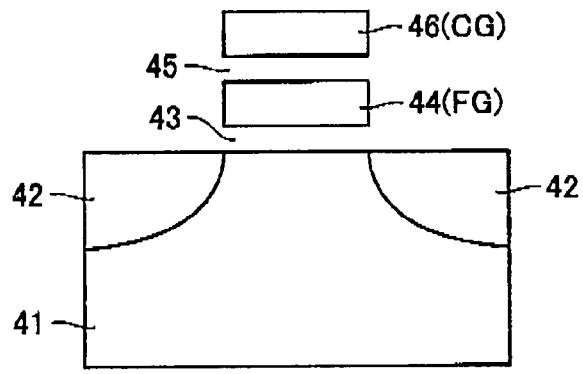
FIG. 4 is a cross-sectional view of one memory cell in the flash memory.
Figure 5:
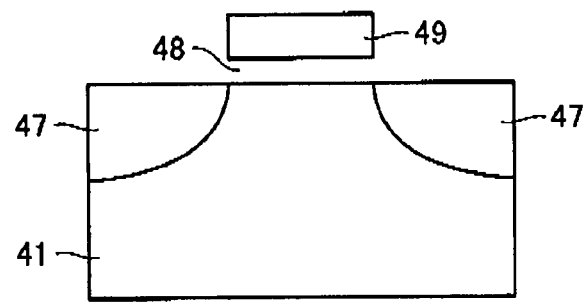
FIG. 5 is a cross-sectional view of selection gates in the flash memory.

FIG. 4 illustrates a cross-sectional structure of a memory cell MC; and FIG. 5 illustrates a cross-sectional structure of selection gates S1 and S2. A substrate 41 has n-type diffusion layers 42 formed therein. The diffusion layers 42 function as a source and a drain of MOSFET included in the memory cell MC, respectively. The substrate 41 also has a floating gate (FG) 44 formed thereon via a gate-insulating layer 43. The floating gate 44 has a control gate (CG) 46 formed thereon via an insulating film 45.

The selection gates S1 and S2 each comprise a substrate 41 and n-type diffusion layers 47 formed in the substrate 41. The diffusion layers 47 serve a source and a drain, respectively. The substrate 41 has a control gate 49 formed thereon via a gate-insulating layer 48.

Figure 6:
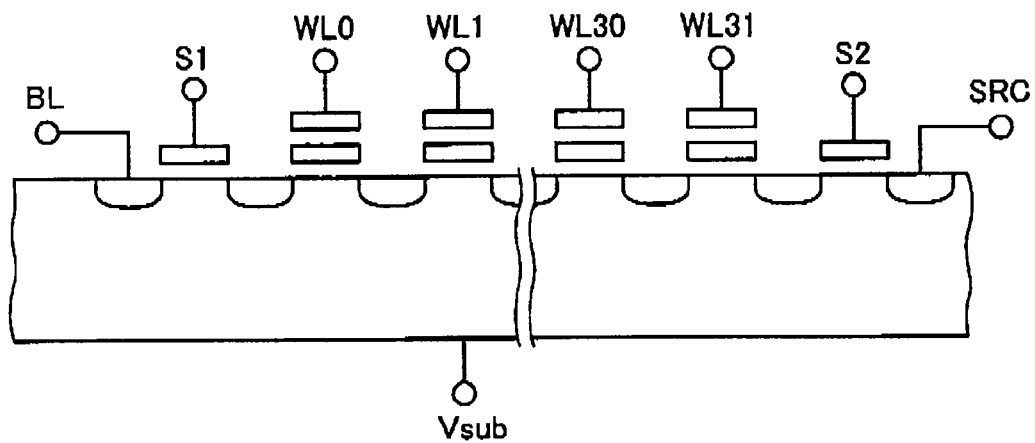
FIG. 6 is a cross-sectional view of a memory cell array in the flash memory.

FIG. 6 illustrates a cross-section of one NAND cell in a memory cell array. In this example, the one NAND cell includes 32 memory cells MC connected in series, each having a configuration illustrated in FIG. 4. The NAND cell includes, on its drain side and source side, first selection gates S1 and S2, each having a configuration illustrated in FIG. 5.

Operations of the NAND cell according to this embodiment will now be described below.

Figure 7A:
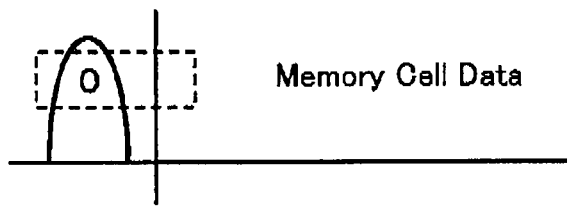
FIG. 7 is a diagram illustrating a relationship between data in a flash memory cell and a threshold in a four-value storing operation.
Figure 7B:
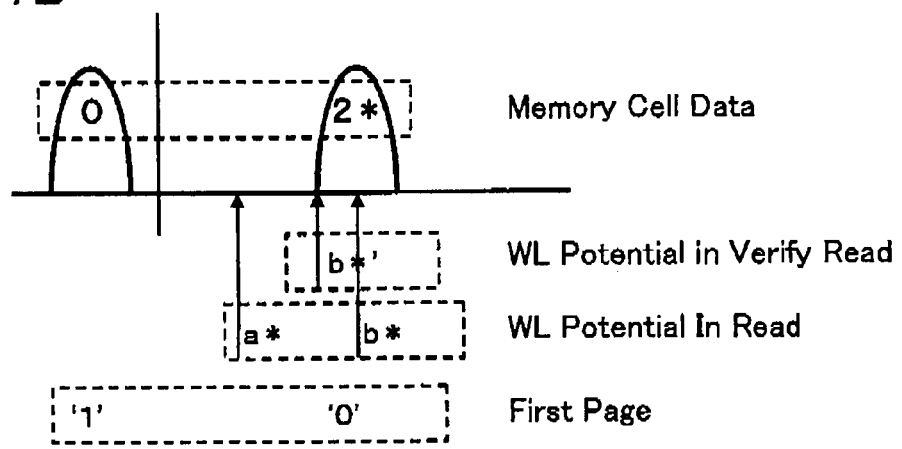
Figure 7C:
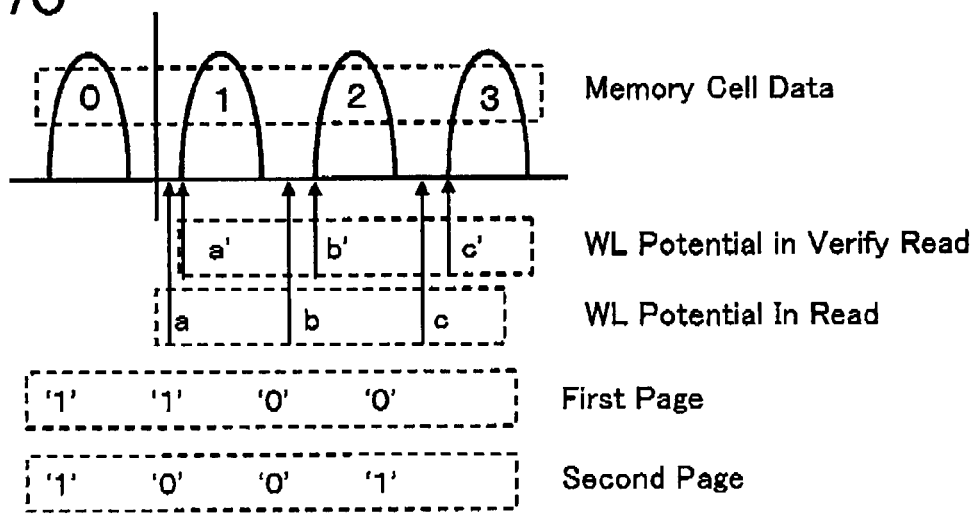

FIG. 7 illustrates a relationship between data in a memory cell and a threshold voltage in the memory cell. As illustrated in FIG. 7A, an erase operation is first performed and data is written to a first page. Then, as illustrated in FIG. 7B, states of data "0" and data "2*" are formed in the corresponding memory cell. Thereafter, upon data being written to a second page, as illustrated in FIG. 7C, states of data "0", data "1", data "2" and data "3", each having a threshold voltage inherent to the four-value storing operation, are formed in the corresponding memory cell. In this embodiment, such a four-value data storing operation is described.

Figure 8:
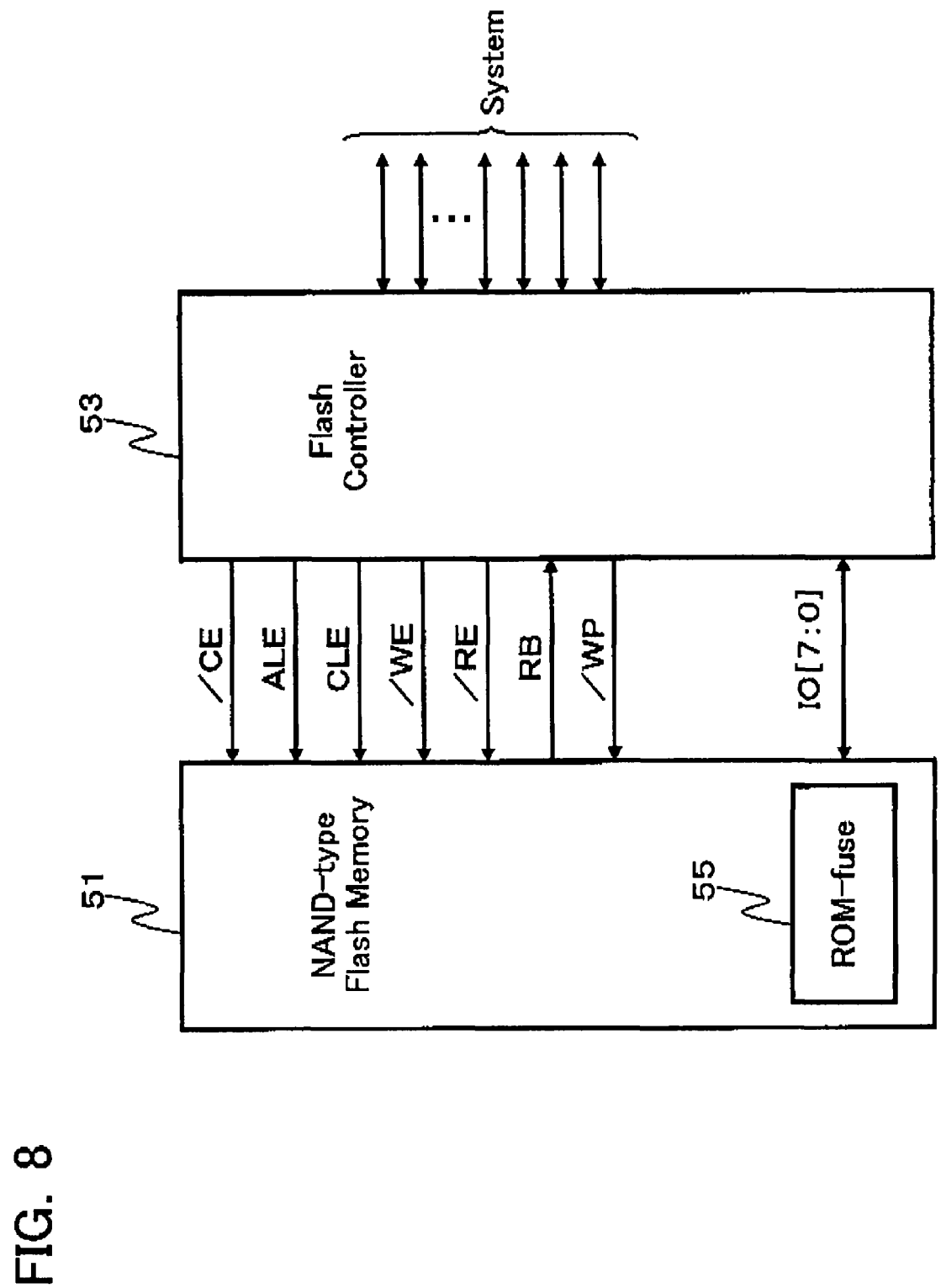
FIG. 8 is a configuration diagram of a memory system of a flash memory.

FIG. 8 illustrates a relationship between a NAND-type flash memory 51 and a flash controller 53 as a memory controller according to this embodiment. As illustrated in FIG. 8, the flash controller 53 accesses the NAND-type flash memory 51 according to a request from a system such as an external host and performs operations such as data read, data write, or data erase operations to control the NAND-type flash memory 51.

The NAND-type flash memory 51 has control pins and an input/output pin. Each of these control pins is to receive a respective control signal from the flash controller 53. The input/output pin is to perform the reception and transmission between the flash controller 53 and the NAND-type flash memory 51, i.e., to receive commands from the flash controller 53 and transmit statuses to the flash controller 53. In this embodiment, the control pins include /CE (Chip Enable), ALE (Address Latch Enable), CLE (Command Latch Enable), /WE (Write Enable), /RE (Read Enable), RB (Ready Busy), and /WP (Write Protect); and the input/output pin includes IO [7:0]. These control pins and the input/output pin connect the NAND-type flash memory 51 to the flash controller 53. In addition, the NAND-type flash memory 51 has a ROM fuse 55 within itself, which stores the acceptable number of pseudo-passes, etc. Although the ROM fuse 55 is formed by memory cells with the same configuration as the memory cells in the memory cell array stated below, it may be formed in the memory cell array or other regions than the memory cell array.

Figure 9:
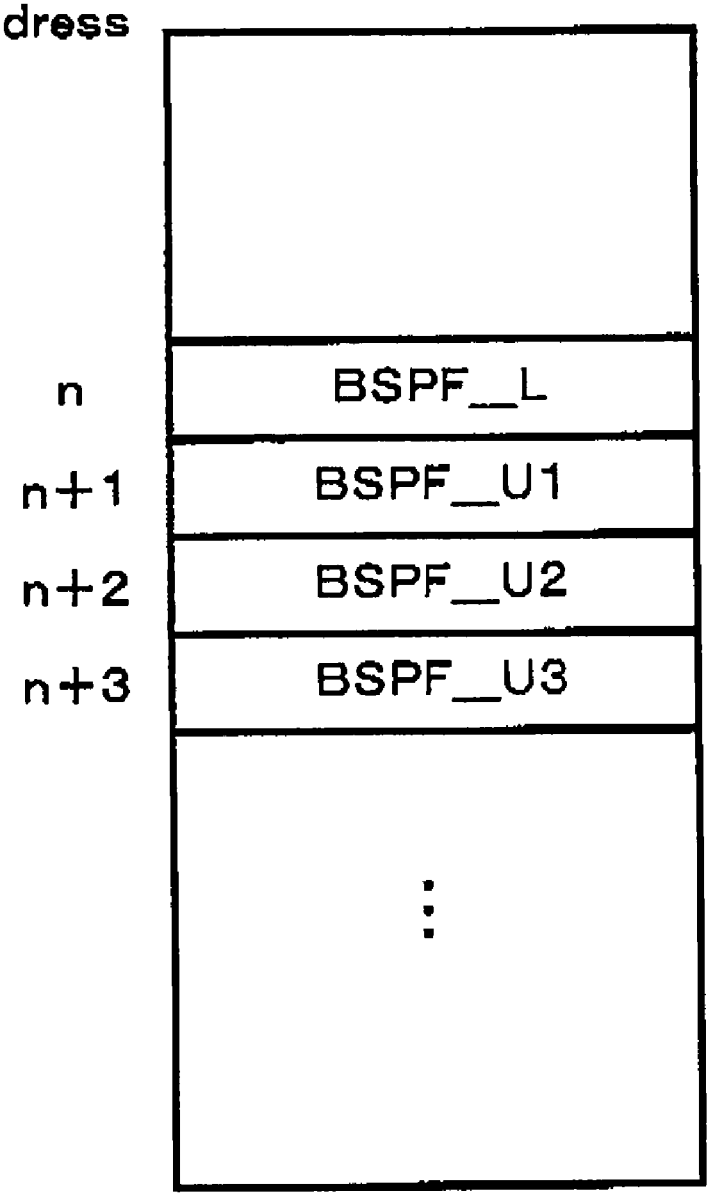
FIG. 9 is a configuration diagram of a register map of the ROM fuse register illustrated in FIG. 8.

FIG. 9 illustrates a configuration of a register map of the ROM fuse register in the ROM fuse 55. The register map stores information of register output signals BSPF_L, BSPF_U1, BSPF_U2 and BSPF_U3 (input signals from the selection circuit stated below) corresponding to respective addresses. Besides, each of BSPF_L, BSPF_U1, BSPF_U2, BSPF_U3, and BSPF stated below represents a respective output signal in a respective bus.

Figure 10:
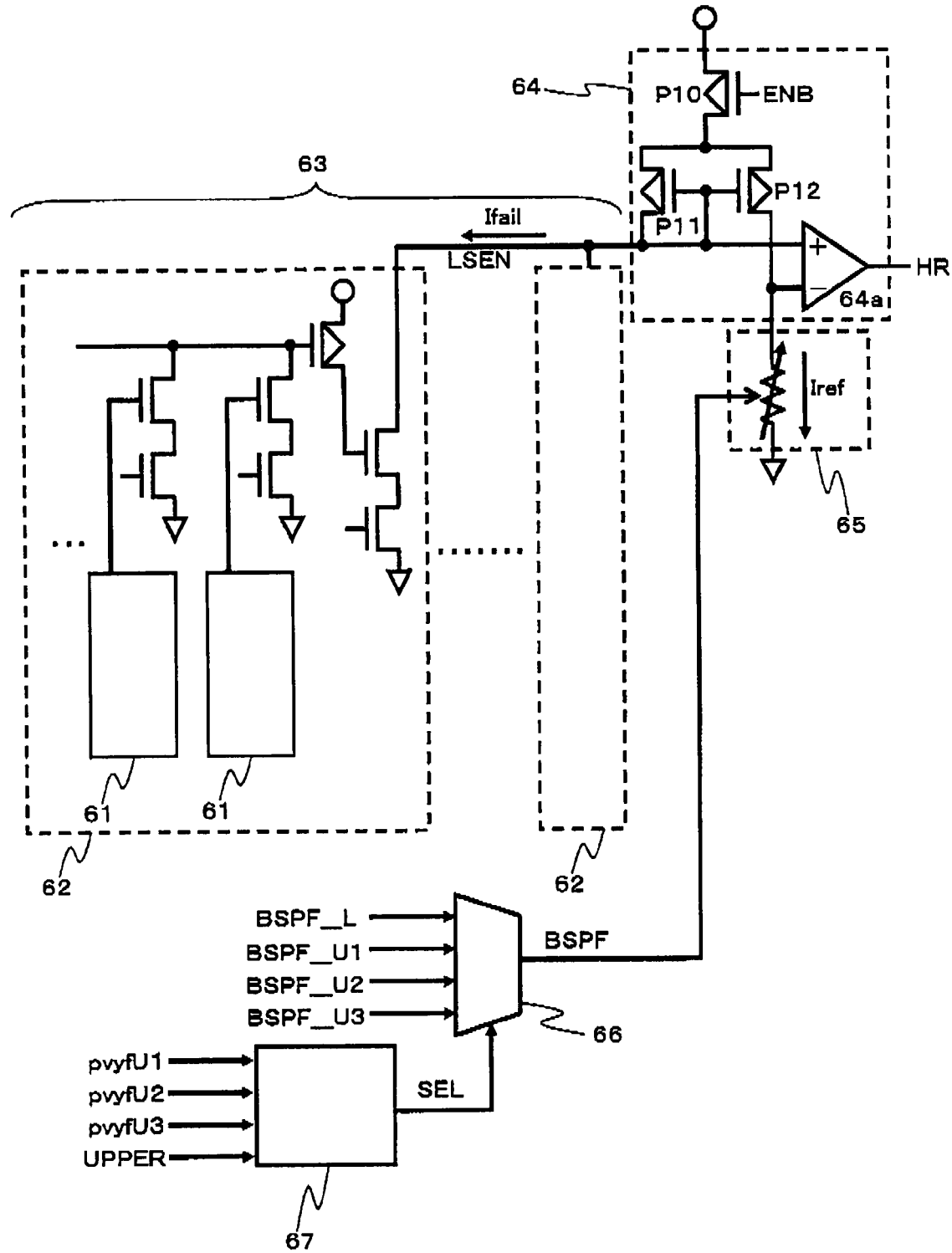
FIG. 10 is a circuit diagram of a pseudo-pass enabled type data register and a data-state comparing circuit in the flash memory.

FIG. 10 is a circuit diagram illustrating a configuration of the verify-judge circuit 5 in the flash memory according to this embodiment.

The verify-judge circuit 5 according to this embodiment comprises: a group of page buffers 63 with a plurality of byte-wise page buffers 62 including page buffers 61 of a plurality of data register circuits; a current comparing circuit 64; a reference-current setting circuit 65; a selection circuit 66; and a selection-signal generation circuit 67.

In the current comparing circuit 64, a fail current Ifail in a sensing line LSEN is compared with a reference current Iref in the reference-current setting circuit 65 to perform a PASS/FAIL-judge. The current comparing circuit 64 comprises: a PMOS current mirror circuit including PMOS transistors P10, P11 and P12; and a comparator 64a. The gate of the PMOS transistor P10 is connected to an activation signal ENB to perform controls. The drain of the PMOS transistor P11 is connected to the gates of the PMOS transistor P11 and the PMOS transistor P12. The drain of the PMOS transistor P11 is also connected to the sensing line LSEN and the comparator 64a. In addition, the drain of the PMOS transistor 212 is connected to the comparator 64a as well as the reference-current setting circuit 65.

The reference-current setting circuit 65 is a variable current source configured in such a way that reference currents Iref can be selected in response to indication signals BSFP. The selection circuit 66 is provided for setting the reference currents Iref of the reference-current setting circuit 65. Specifically, in the selection circuit 66, the following register output signals are independently set and conducted via respective buses:

(1) a register output signal BSPF_L for setting the acceptable number of pseudo-passes in a first-page write verify;

(2) a register output signal BSPF_U1 for setting the acceptable number of pseudo-passes in a write verify for data "1" in the second page;

(3) a register output signal BSPF_U2 for setting the acceptable number of pseudo-passes in a write verify for data "2" in the second page; and (4) a register output signal BSPF_U3 for setting the acceptable number of pseudo-passes in a write verify for data "3" in the second page.

In the selection circuit 66, a predetermined register output signal is output as an output signal BSPF from the selection circuit 66 in response to a selection signal SEL output from the selection-signal generation circuit 67. The output signal BSPF is then input to the reference-current setting circuit 65, thereby generating a reference current Iref corresponding to the predetermined acceptable number of pseudo-passes.

A write verify operation according to this embodiment will now be described below. As described above, the NAND-type flash memory of the semiconductor storage device according to this embodiment is a multi-value storage memory that may store 2 bits in one memory cell. Thus, judgment is performed on a four-value storage state basis. As illustrated in FIG. 7, after the write operations in the first page, further write operations are performed in the second page. Thus, the write verify operations are performed separately in the first page and the second page. The discrimination between the write operations in the first page and the second page may be achieved based on the state of the input signal UPPER.

A write verify operation in the first page will now be described below based on FIG. 11.

Beginning in step 102 (S102), information is written in the first page. Specifically, write pluses are applied to a memory cell depending on the information to be written to perform a write operation therein. Once the information is written, the application of voltage is terminated. In this state, the input signal UPPER has been set to "0" and input to the selection-signal generation circuit 67. Upon completion of step 102, the process transitions to step 104.

In step 104 (S104), a verify read operation is performed at write level of the first page and a determination is made as to whether all memory cells prove to be "PASS". Specifically, as illustrated in FIG. 7B, let "b*" be the potential of a word line (WL), a verify read is performed. As a result, if it is determined in step 104 that all memory cells prove to be "PASS", i.e., information is stored in normal state therein, then the process transitions to step 118. In step 104, if one or more of the memory cells are detected that do not store information in normal state, then those memory cells prove to be "FAIL" and the process transitions to step 106.

In step 106 (S106), a determination is made as to whether pseudo-pass activation is "OK". Specifically, the amount of threshold-voltage shift is expected to be small at the beginning of the write operation to a memory cell in a page, and it is expected that there are a small number of memory cells that reach their verify levels to terminate their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation if the acceptable number of pseudo-passes is zero. Thus, this method may be combined with other methods wherein the pseudo-pass activation is determined, by compulsion, to be not "OK". If it is determined in step 106 that the pseudo-pass activation is "OK", then the process transitions to step 108. Alternatively, if it is determined in step 106 that the pseudo-pass activation is not "OK", then the process transitions to step 114.

In step 108 (S108), the number of verify fails, i.e., the number of defects, is measured. Upon completion of step 108, the process transitions to step 110.

In step 110 (S110), a determination is made as to whether the number of verify fails measured in step 108 is not more than an acceptable number of verify fails. In this case, the acceptable number of verify fails to be set is defined by a reference current Iref as illustrated in FIG. 10. The reference current Iref is set by selecting a register output signal BSPF_L for setting the acceptable number of pseudo-passes in write verify for the first-page based on a selection signal SEL at the selection circuit 66, outputting the signal BSPF_L as an output signal BSPF, and inputting it to the reference-current setting circuit 65.

Figures 11, 12:
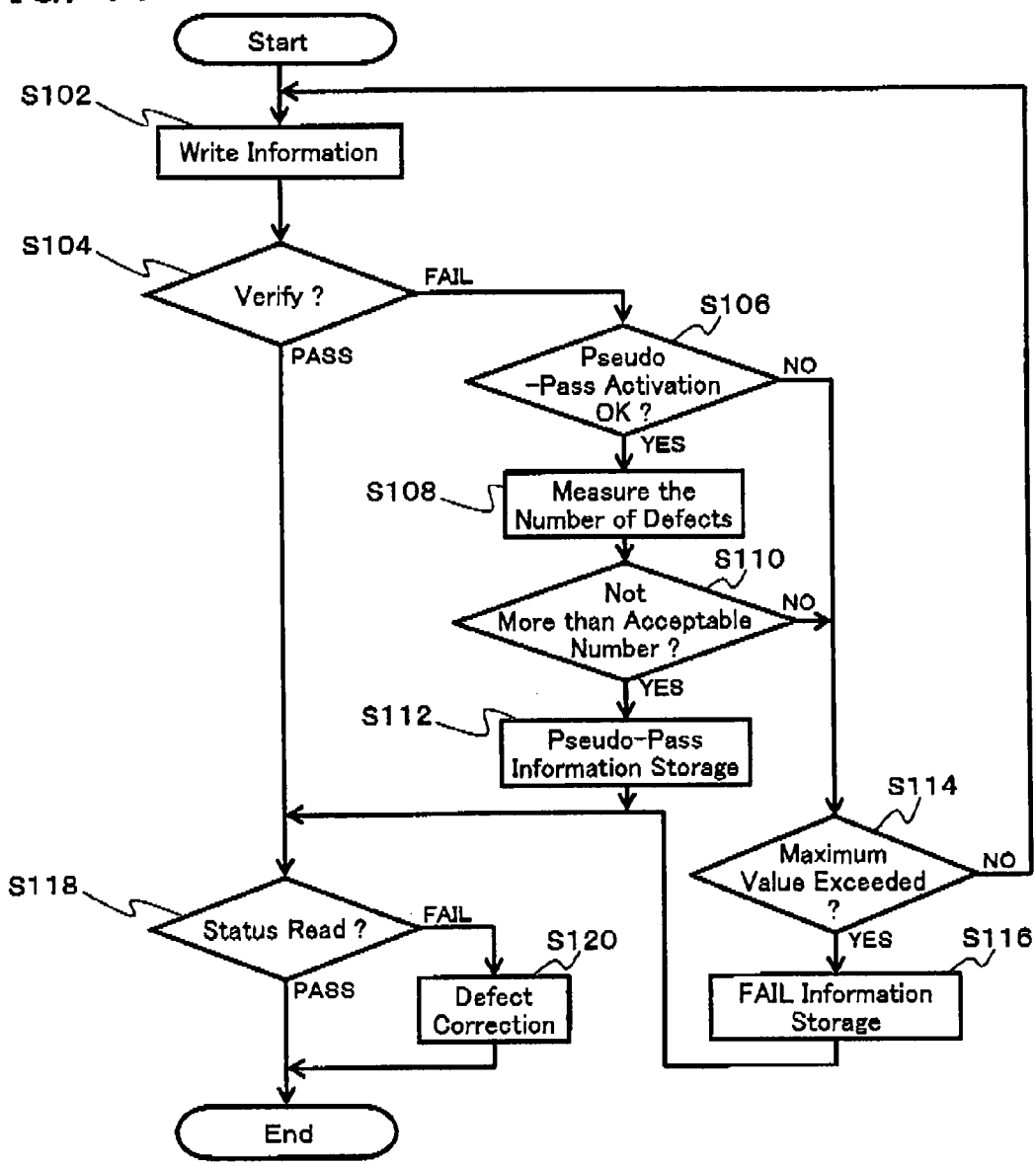
FIG. 11 is a flowchart of a write operation (1) according to a first embodiment.
FIG. 12 is a diagram illustrating a relationship between input signals and register output signals according to the first embodiment.

FIG. 12 illustrates a relationship between signals that are input to the selection-signal generation circuit 67 and register output signals that are selected by the selection circuit 66 based on selection signals SEL generated by the selection-signal generation circuit 67 according to this embodiment. In verifying the first page, "0" is input as the input signal UPPER that is to be input to the selection-signal generation circuit 67, thereby outputting a register output signal BSPF_L as an output signal BSPF from the selection circuit 66.

If it is determined in step 110 that the number of verify fails is not more than the acceptable number of verify fails, then the process transitions to step 112. Alternatively, if it is determined in step 110 that the number of verify fails is more than, i.e., exceeds, the acceptable number, then the process transitions to step 114.

In step 112 (S112), such information is stored that indicates the verify operation has been passed by way of the pseudo-pass. The stored information is configured so as to read, and determine, by way of status read commands stated below, whether the pseudo-pass results in success or not. Upon completion of step 112, the process transitions to step 118.

In step 114 (S114), a determination is made as to whether the number of write operations or the time of write operation exceeds the preset maximum number of write operations or the preset longest time of write operation. Specifically, the maximum number of write operations or the longest time of write operation is, for example, preset and stored in advance in the NAND-type flash memory according to this embodiment. These determinations are made by the comparison between the preset maximum number of write operations or the preset longest time of write operation and the actual number of write operations or the actual time of write operation. Besides, although not depicted in the drawing, the NAND-type flash memory according to this embodiment is provided with a counter for measuring the actual number of write operations or a timer for measuring the actual time of write operation. That counter or timer initiates and performs measurement of the number of write operations or the time of write operation.

If it is determined in step 114 that the actual number of write operations measured exceeds the preset maximum number of write operations or the actual time of write operation measured exceeds the preset longest time of write operation, then the process transitions to step 116. Alternatively, if it is determined in step 114 that the actual number of write operations measured does not exceed the preset maximum number of write operations or the actual time of write operation measured does not exceed the preset longest time of write operation, then the process transitions to step 102 and the information write operation is performed again.

In step 116 (S116), it is determined that the write operation has ended in failure for the page data in question and the FAIL information that indicates the failed write operation for the page data is stored in a register of the NAND-type flash memory (FAIL information storage). In this way, the write operation is performed. Upon completion of step 116, the process transitions to step 118.

In step 118 (S118), a determination is made as to whether the status read is "PASS". Specifically, the FAIL information stored in step 116 may be read, e.g., using a status read command. Thus, if the obtained result is "PASS" in step 104, and after the completion of step 112 or 116, then a status read command is sent to the NAND-type flash memory from a control device provided external to the NAND-type flash memory. Upon receipt of the command, the NAND-type flash memory returns it to the control device to convey such information that indicates the completion of the write operation at the NAND-type flash memory.

If the obtained result is "PASS" in step 118, then the write verify operation in the first page terminates. Alternatively, if the obtained result is "FAIL" in step 118, then the process transitions to step 120.

In step 120 (S120), defect correction is performed. Specifically, the page data determined as "FAIL" is rewritten with another page. Then, necessary operations are performed wherein the page determined as "FAIL" is processed as a defected page or a defected block, for example. Upon completion of step 120, the write verify operation in the first page terminates. Besides, the operations of steps 102 through 116 are performed at the NAND-type flash memory 51 illustrated in FIG. 8, while the operations of steps 118 and 120 are performed at the flash controller 53 as a memory controller illustrated in FIG. 8.

Figure 13:
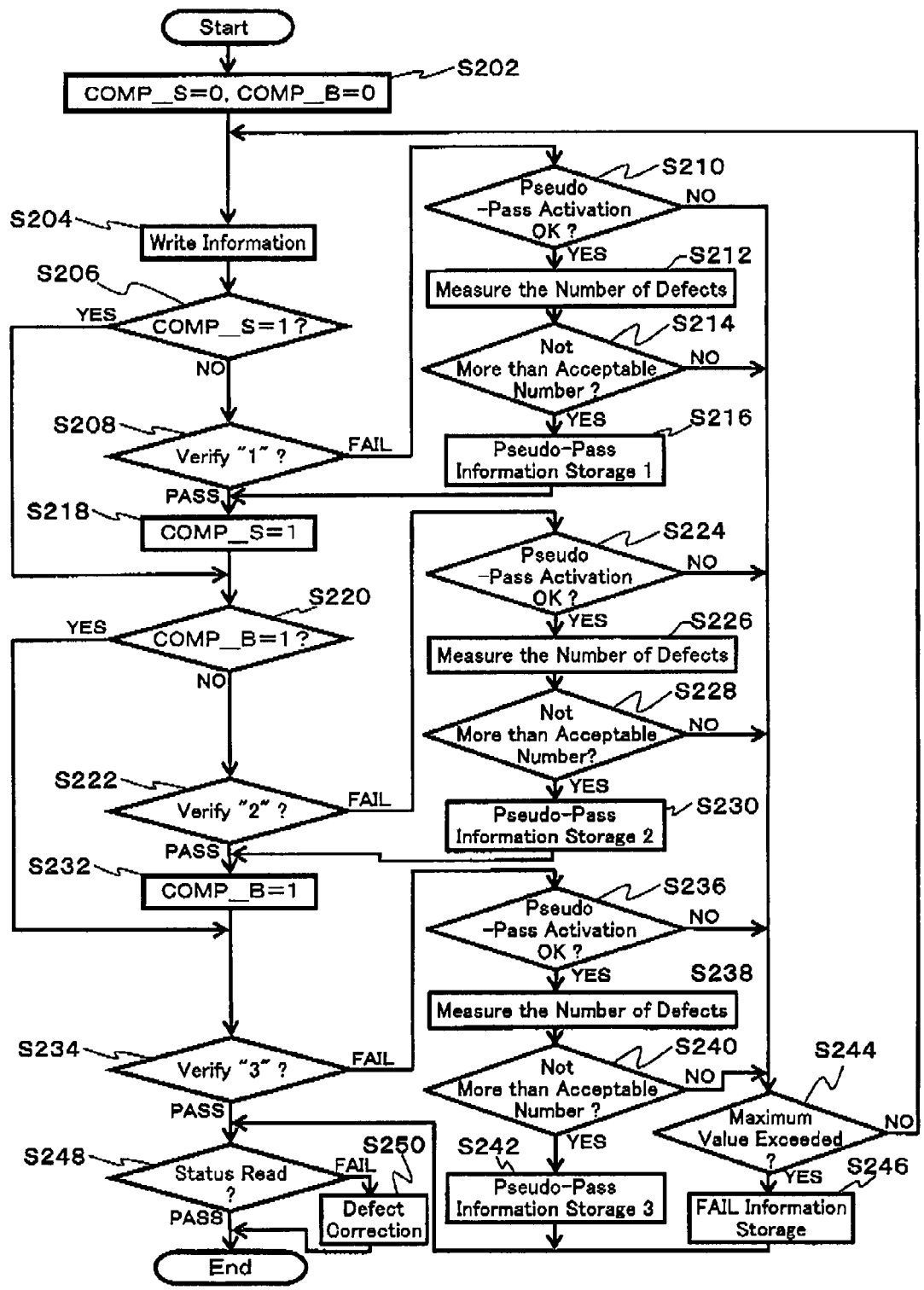
FIG. 13 is a flowchart of a write operation (2) according to the first embodiment.

A write verify operation in the second page will now be described below based on FIG. 13. Besides, in order to identify the write operation to be performed in the second page, the input signal UPPER is set to "1" and input to the selection-signal generation circuit 67.

Beginning in step 202 (S202), verification flags COMP_S and COMP_B are initialized in the register 20 of FIG. 1. Each of these signals indicates whether a verify read operation needs to be carried out on data in a corresponding memory cell. In this embodiment, COMP_S and COMP_B are both set to "0". This embodiment employs a scheme that begins a write operation with a distribution with lower threshold voltages. Therefore, COMP_S may be assigned as a signal that identifies a verify complete pass to data "1" in the corresponding memory cell or that identifies the acceptable number of pseudo-passes not being exceeded, while COMP_B may be assigned as a signal that identifies a verify complete pass to data "2" in the corresponding memory cell or that identifies the acceptable number of pseudo-passes not being exceeded.

Then, in step 204 (S204), information is written to the second page. Specifically, write pluses are applied to a memory cell depending on the information to be written and a write operation is performed thereto. Once the information being written, the application of voltage is terminated. Upon completion of step 204, the process transitions to step 206.

In step 206 (S206), a determination is made as to whether COMP_S is "1". If it is determined in step 206 that COMP_S is "1", then the process transitions to step 220. Alternatively, if it is determined in step 206 that COMP_S is not "1", i.e., if COMP_S is determined to be "0", the process transitions to step 20B.

In step 208 (S208), a verify read operation is performed at write level for the data "1" in the corresponding memory cell of the second page. Then, a determination is made as to whether the data "1" in all corresponding memory cells proves to be "PASS". Specifically as illustrated in FIG. 7C, let "a'" be the potential of the word line (WL), a verify read is performed. As a result, if it is determined in step 208 that the data "1" in all corresponding memory cells proves to be "PASS", i.e., if they are determined to store data in normal state, then the process transitions to step 218. In step 208, if one or more of the memory cells are detected that do not store information in normal state, then those memory cells prove to be "FAIL" and the process transitions to step 210.

In step 210 (S210), a determination is made as to whether the pseudo-pass activation is "OK". Specifically, the amount of threshold-voltage shift is expected to be small at the beginning of the write operation to a memory cell in a page, and it is expected that there are a small number of memory cells that reach their verify levels to terminate their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 210 that the pseudo-pass activation is "OK", then the process transitions to step 212. Alternatively, if it is determined in step 210 that the pseudo-pass activation is "NO", then the process transitions to step 244.

In step 212 (S212), the number of verify fails, i.e., the number of defects, is measured. Upon completion of step 212, the process transitions to step 214.

In step 214 (S214), a determination is made as to whether the number of verify fails measured in step 212 is not more than an acceptable number of verify fails. In this case, the acceptable number of verify fails to be set is defined by a reference current Iref as illustrated in FIG. 10. The reference current Iref is set by selecting, as illustrated in FIG. 12, a register output signal BSPF_U1 for setting the acceptable number of pseudo-passes in write verify for data "1" in the second page based on a selection signal SEL at the selection circuit 66, outputting the signal BSPF_U1 as an output signal BSPF, and inputting it to the reference-current setting circuit 65.

Specifically, as illustrated in FIG. 12, in verifying data "1" in the second page, a register output signal BSPF_U1 is output as an output signal BSPF from the selection circuit 66, by inputting "1" as pvfyU1, "0" as pvfyU2, "0" as pvfyU3, and "1" as UPPER at the selection-signal generation circuit 67. Wherein, pvfyU1, pvfyU2 and pvfyU3 indicate, when each turns to "1", that respective verify operations are being performed for the corresponding data "1", "2" and "3" in the second page.

If it is determined in step 214 that the number of verify fails is not more than the acceptable number of verify fails, then the process transitions to step 216. Alternatively, if it is determined in step 214 that the number of verify fails is more than, i.e., exceeds, the acceptable number, then the process transitions to step 244.

In step 216 (S216), such information is stored in a register of a pseudo-pass information storage 1 that indicates the verify operation has been passed by way of the pseudo-pass, The stored information is configured so as to read, and determine, by way of known status read commands, whether the pseudo-pass results in success or not. Upon completion of step 216, the process transitions to step 218.

In step 218 (S218), as the data "1" in the corresponding memory cell being complete "PASS" or the number of verify fails not more than the acceptable number of verify fails in the verify operation, no verify read operation is required from then on for the data "1" in the corresponding memory cell. Thus, the value of COMP_S is changed to "1". Upon completion of step 218, the process transitions to step 220.

In step 220 (S220), a determination is made as to whether COMP_B is "1". If it is determined in step 220 that COMP_B is "1", then the process transitions to step 234. Alternatively, if it is determined in step 220 that COMP_B is not "1", i.e., if COMP_B is determined to be "0", then the process transitions to step 222.

In step 222 (S222), a verify read operation is performed at write level for the data "2" in the corresponding memory cell of the second page. Then, a determination is made as to whether the data "2" in all corresponding memory cells proves to be "PASS". Specifically, as illustrated in FIG. 7C, let "b'" be the potential of the word line (WL), a verify read is performed. As a result, if it is determined in step 222 that the data "2" in all corresponding memory cells proves to be "PASS", i.e., if they are determined to store data in normal state, then the process transitions to step 232. In step 222, if one or more of the memory cells are detected that do not store information in normal state, then those memory cells prove to be "FAIL" and the process transitions to step 224.

In step 224 (S224), a determination is made as to whether the pseudo-pass activation is "OK". Specifically, the amount of threshold-voltage shift is expected to be small at the beginning of the write operation to a memory cell in a page, and so is the number of memory cells that reach their verify levels to terminate their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 224 that the pseudo-pass activation is "OK", then the process transitions to step 226. Alternatively, if it is determined in step 224 that the pseudo-pass activation is "NO", then the process transitions to step 244.

In step 226 (S226), the number of verify fails, i.e., the number of defects, is measured. Upon completion of step 226, the process transitions to step 228.

In step 228 (S228), the number of verify fails measured in step 226 is not more than an acceptable number of verify fails. In this case, the acceptable number of verify fails to be set is defined by a reference current Iref as illustrated in FIG. 10. The reference current Iref is set by selecting, as illustrated in FIG. 12, a register output signal BSPF_U2 for setting the acceptable number of pseudo-passes in write verify for data "2" in the second page based on a selection signal SEL at the selection circuit 66, outputting the signal BSPF_U2 as an output signal BSPF, and inputting it to the reference-current setting circuit 65.

Specifically, as illustrated in FIG. 12, in verifying data "2" in the second page, a register output signal BSPF_U2 is output as an output signal BSPF from the selection circuit 66, by inputting "0" as pvfyU1, "1" as pvfyU2, "0" as pvfyU3, and "1" as UPPER at the selection-signal generation circuit 67.

If it is determined in step 228 that the number of verify fails is not more than the acceptable number of verify fails, then the process transitions to step 230. Alternatively, if it is determined in step 228 that the number of verify fails is more than, i.e., exceeds, the acceptable number, then the process transitions to step 244.

In step 230 (S230), such information is stored in a register of a pseudo-pass information storage 2 that indicates the verify operation being passed by way of the pseudo-pass. The stored information is configured so as to read, and determine, by way of known status read commands, whether the pseudo-pass results in success or not. Upon completion of step 230, the process transitions to step 232.

In step 232 (S232), as the data "2" in the corresponding memory cell being complete "PASS" or the number of verify fails not more than the acceptable number in the verify operation, no verify read operation is required from then on for the data "2" in the corresponding memory cell. Thus, the value of COMP_B is changed to "1". Upon completion of step 232, the process transitions to step 234.

In step 234 (S234), a verify read operation is performed at write level for the data "3" in the corresponding memory cell of the second page. Then, a determination is made as to whether the data "3" in all corresponding memory cells proves to be "PASS". Specifically, as illustrated in FIG. 7C, let "c'" be the potential of the word line (WL), a verify read is performed. As a result, if it is determined in step 234 that the data "3" in all corresponding memory cells proves to be "PASS", i.e., if they are determined to store data in normal state, then the process transitions to step 248. In step 234, if one or more of the memory cells are detected that do not store information in normal state, then those memory cells prove to be "FAIL" and the process transitions to step 236.

In step 236 (S236), a determination is made as to whether the pseudo-pass activation is "OK". Specifically, the amount of threshold-voltage shift is expected to be small at the beginning of the write operation to a memory cell in a page, and so is the number of memory cells that reach their verify levels to terminate their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 236 that the pseudo-pass activation is "OK", then the process transitions to step 238. Alternatively, if it is determined in step 236 that the pseudo-pass activation is "NO", then the process transitions to step 244.

In step 238 (S238), the number of verify fails, i.e., the number of defects, is measured. Upon completion of step 238, the process transitions to step 240.

In step 240 (S240), it is determined whether or not the number of verify fails measured in step 238 is not more than an acceptable number of verify fails. In this case, the acceptable number of verify fails to be set is defined by a reference current Iref as illustrated in FIG. 10. The reference current Iref is set by selecting, as illustrated in FIG. 12, a register output signal BSPF_U3 for setting the acceptable number of pseudo-passes in write verify for data "3" in the second page based on a selection signal SEL at the selection circuit 66, outputting the signal BSPF_U3 as an output signal BSPF, and inputting it to the reference-current setting circuit 65. Additionally, in step 240, a total acceptable number of the verify-fails for data "1", "2", and "3" (a total acceptable number) may be determined in advance. Then, an acceptable number for data "3" may be a number obtained by subtracting the actual number of defects obtained in step 212 and 226 from the total acceptable number.

Specifically, as illustrated in FIG. 12, in verifying data "3" in the second page, a register output signal BSPF_U3 is output as an output signal BSPF from the selection circuit 66, by inputting "0" as pvfyU1, "0" as pvfyU2, "1" as pvfyU3, and "1" as UPPER at the selection-signal generation circuit 67.

If it is determined in step 240 that the number of verify fails is not more than the acceptable number of verify fails, then the process transitions to step 242. Alternatively, if it is determined in step 240 that the number of verify fails is more than, i.e., exceeds, the acceptable number, then the process transitions to step 244.

In step 242 (S242), such information is stored in a register of a pseudo-pass information storage 3 that indicates the verify operation being passed by way of the pseudo-pass. The stored information is configured so as to read, and determine, by way of known status read commands, whether the pseudo-pass results in success or not. Upon completion of step 242, the process transitions to step 248.

In step 244 (S244), a determination is made as to whether the number of write operations or the time of write operation exceeds the preset maximum number of write operations or the preset longest time of write operation. Specifically, the maximum number of write operations or the longest time of write operation is, for example, preset and stored in advance in the NAND-type flash memory according to this embodiment. These determinations are made by the comparison between the preset maximum number of write operations or the preset longest time of write operation and the actual number of write operations or the actual time of write operation. Besides, although not depicted in the drawing, the NAND-type flash memory according to this embodiment is provided with a counter for measuring the actual number of write operations or a timer for measuring the actual time of write operation. That counter or timer initiates and performs measurement of the number of write operations or the time of write operation.

If it is determined in step 244 that the actual number of write operations measured exceeds the preset maximum number of write operations or the actual time of write operation measured exceeds the preset longest time of write operation, then the process transitions to step 246. Alternatively, if it is determined in step 244 that the actual number of write operations measured does not exceed the preset maximum number of write operations or the actual time of write operation measured does not exceed the preset longest time of write operation, then the process transitions to step 204 and the information write operation is performed again.

In step 246 (S246), it is determined that the write operation fails for the page data in question and the FAIL information that indicates the failed write operation for the page data is stored in a register of the NAND-type flash memory (FAIL information storage). In this way, the write operation is performed. Upon completion of step 246, the process transitions to step 248.

In step 248 (S248), a determination is made as to whether the status read is "PASS". Specifically, the FAIL information stored in step 246 may be read, e.g., using a status read command. Thus, if the obtained result is "PASS" in step 234, and after the completion of step 242 or 246, then a status read command is sent to the NAND-type flash memory from a control device provided external to the NAND-type flash memory. Upon receipt of the command, the NAND-type flash memory returns it to the control device to convey such information that indicates the completion of the write operation at the NAND-type flash memory.

If the obtained result is "PASS" in step 248, then the write verify operation in the second page terminates. Alternatively, if the obtained result is "FAIL" in step 248, then the process transitions to step 250.

In step 250 (S250), defect correction is performed. Specifically, the page data determined as "FAIL" is rewritten with another page. Then, necessary operations are performed wherein the page determined as "FAIL" is processed as a defected page or a defected block, for example. Upon completion of step 250, the write verify operation in the second page terminates. Besides, the operations of steps 202 through 246 are performed at the NAND-type flash memory 51 illustrated in FIG. 8, while the operations of steps 248 and 250 are performed at the flash controller 53 as a memory controller illustrated in FIG. 8.

In this embodiment, it is necessary to set an acceptable number of fails suitable for data depending on the distribution of the threshold voltages. For example, the setting of the acceptable number of fails may be carried out by a method for storing the acceptable number in a predetermined data register by a ROM-fuse read operation that is automatically performed within the NAND-type flash memory of the semiconductor storage device according to this embodiment when the NAND-type flash memory is powered on. Alternatively, it may be carried out by performing one or more write operations to the data register of the NAND-type flash memory each time an external control device performs a write operation or after the power-on of the NAND-type flash memory.

Conventionally, since only the complete PASS is permitted, there are several issues that could disable write operations for data "1" in the corresponding memory cell due to the memory cell property degradation in the NAND-type flash memory during operation of cashed program, etc., or that could reduce average write data rates when a significant amount of time is spent in writing. In this embodiment, however, these issues may be addressed by setting an acceptable number of fails suitable for data depending on the distribution of the threshold voltages, and the overall write operation process may be finished in a short time in the NAND-type flash memory of a semiconductor storage device.

That is, conventionally, since the pseudo-pass may not be recognized in a memory cell until at least a pseudo-pass function is activated, write operations and verify operations should be repeated accordingly, which might lead to increase in time for overall write operations. In addition, when the pseudo-pass function is activated all the time from an early stage where memory cells have a small amount of threshold-voltage shift, a significant time may be spent in overall write operations. This is because as the pseudo-pass function may not necessarily be required in such the early stage. Further, with respect to the pseudo-pass function, a fixed acceptable number of fails is set for each page.

In this embodiment, the overall time for writing may be reduced by setting an acceptable number of fails suitable for data depending on the distribution of the threshold voltages.

Second Embodiment

A write verify operation according to a second embodiment will now be described below. The NAND-type flash memory of the semiconductor storage device according to this embodiment is, similar to the first embodiment, a multi-value storage memory that may store 2 bits in one memory cell. This embodiment includes a verify operation that involves a step of performing a verify skip operation. Specifically, at the beginning of the write operation to a memory cell, the amount of threshold voltage shift is small and so is the number of memory cells that reach their verify levels. Thus, performing a verify read at this stage would result in "FAIL". In addition, performing a pseudo-pass-judge at this state would likely result in "FAIL". Thus, what would reduce the total amount of time for writing is not performing any verify read at this stage. Therefore, conditions for a predetermined verify skip are defined and a determination is made as to whether the verify operation is to be skipped or not.

Figure 14:
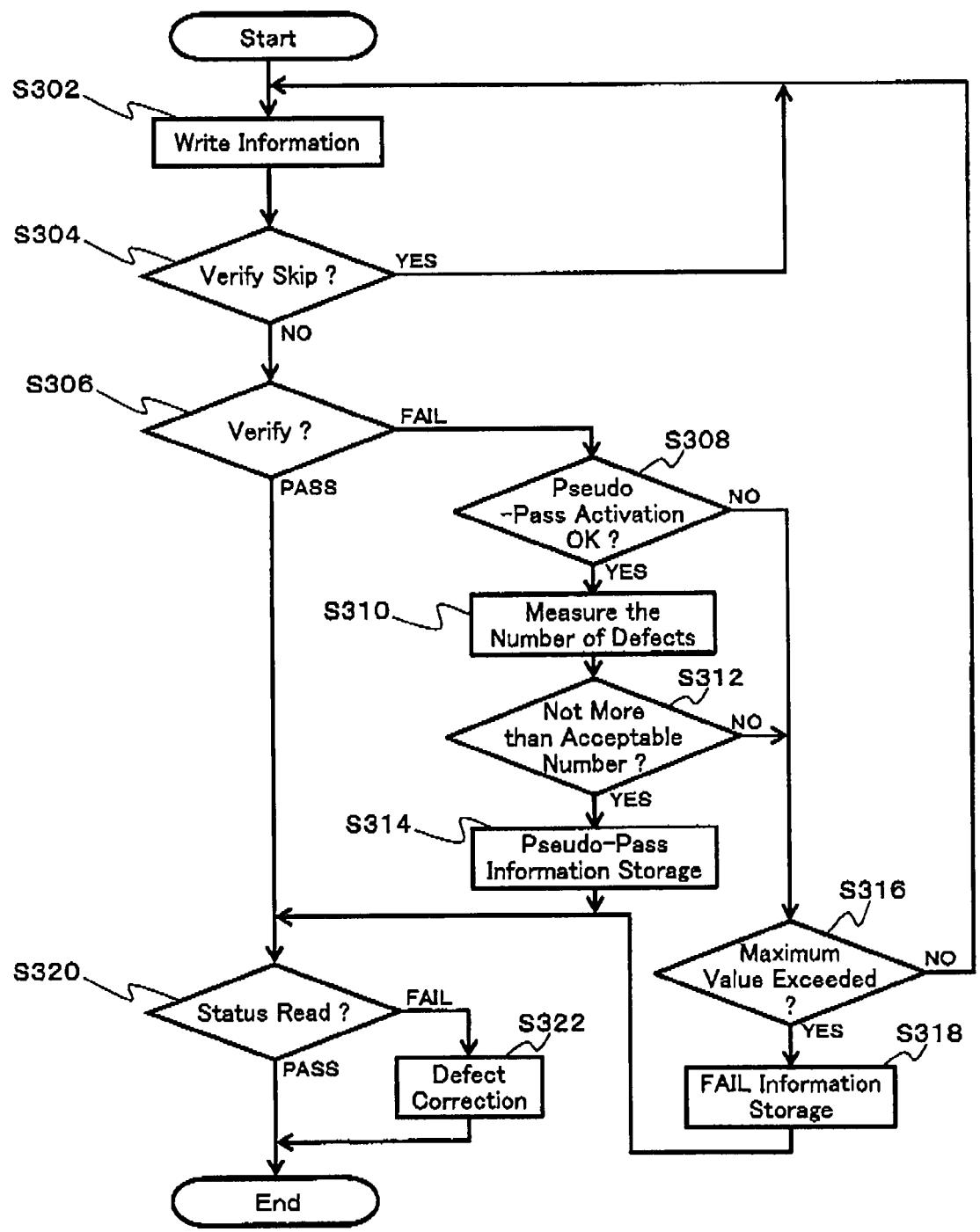
FIG. 14 is a flowchart of a write operation (1) according to a second embodiment.

A write verify operation in the first page will now be described below based on FIG. 14.

Beginning in step 302 (S302), information is written to the first page. Specifically, write pluses are applied to a memory cell depending on the information to be written and a write operation is performed thereto. Once the information being written, the application of voltage is terminated. In this state, the input signal UPPER has been set to "0" and input to the selection-signal generation circuit 67. Upon completion of step 302, the process transitions to step 304.

In step 304 (S304), a determination is made as to whether a verify skip operation is to be performed or not. Specifically, the number of write pluses applied to the corresponding memory cell is measured by a counter. It is assumed that if the number of write pluses applied is not more than a predetermined value, then the verify skip operation is performed, otherwise the verify skip operation is not performed. If the number of write pulses applied is not more than a predetermined value that is set by known means, it is determined that the pseudo-pass activation is not "OK". Besides, the verify skip operation may be based on other criteria than the number of write pluses applied. If it is determined in step 304 that the verify skip operation is to be performed, then the process transitions to step 302. Alternatively, if it is determined in step 304 that the verify skip operation is not to be performed, then the process transitions to step 306.

In step 306 (S306), a verify read operation is performed at write level of the first page. Then, a determination is made as to whether all memory cells prove to be "PASS". Specifically, as illustrated in FIG. 7B, let "b*'" be the potential of the word line (WL), a verify read is performed. As a result, if it is determined in step 306 that all memory cells prove to be "PASS", i.e., if they are determined to store data in normal state, then the process transitions to step 320. In step 306, if one or more of the memory cells are detected that do not store information in normal state, then those memory cells prove to be "FAIL" and the process transitions to step 308.

In step 308 (S308), a determination is made as to whether the pseudo-pass activation is "OK". Specifically, the amount of threshold-voltage shift is expected to be small at the beginning of the write operation to a memory cell in a page, and so is the number of memory cells that reach their verify levels to terminate their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 308 that the pseudo-pass activation is "OK", then the process transitions to step 310. Alternatively, if it is determined in step 308 that the pseudo-pass activation is not "OK", then the process transitions to step 316.

In step 310 (S310), the number of verify fails, i.e., the number of defects, is measured. Upon completion of step 310, the process transitions to step 312.

In step 312 (S312), a determination is made as to whether the number of verify fails measured in step 310 is not more than the acceptable number of verify fails. In this case, the acceptable number of verify fails to be set is defined by a reference current Iref as illustrated in FIG. 10. The reference current Iref is set by selecting a register output signal BSPF_L for setting the acceptable number of pseudo-passes in write verify for the first-page based on a selection signal SEL at the selection circuit 66, outputting the signal BSPF_L as an output signal BSPF, and inputting it to the reference-current setting circuit 65.

FIG. 12 illustrates a relationship between signals that are input to the selection-signal generation circuit 67 and register output signals that are selected by the selection circuit 66 based on selection signals SEL generated by the selection-signal generation circuit 67 according to this embodiment. In verifying the first page, "0" is input to the input signal UPPER that is to be input to the selection-signal generation circuit 67, thereby outputting a register output signal BSPF_L as an output signal BSPF from the selection circuit 66.

If it is determined in step 312 that the number of verify fails is not more than the acceptable number of verify fails, then the process transitions to step 314. Alternatively, if it is determined in step 312 that the number of verify fails is more than, i.e., exceeds, the acceptable number, then the process transitions to step 316.

In step 314 (S314), such information is stored that indicates the verify operation being passed by way of the pseudo-pass. The stored information is configured so as to read, and determine, by way of a status read command stated below, whether the pseudo-pass results in success or not. Upon completion of step 314, the process transitions to step 320.

In step 316 (S316), a determination is made as to whether the number of write operations or the time of write operation exceeds the preset maximum number of write operations or the preset longest time of write operation. Specifically, the maximum number of write operations or the longest time of write operation is, for example, preset and stored in advance in the NAND-type flash memory according to this embodiment. These determinations are made by the comparison between the preset maximum number of write operations or the preset longest time of write operation and the actual number of write operations or the actual time of write operation. Besides, although not depicted in the drawing, the NAND-type flash memory according to this embodiment is provided with a counter for measuring the actual number of write operations or a timer for measuring the actual time of write operation. That counter or timer initiates and performs measurement of the number of write operations or the time of write operation.

If it is determined in step 316 that the actual number of write operations measured exceeds the preset maximum number of write operations or the actual time of write operation measured exceeds the preset longest time of write operation, then the process transitions to step 318. Alternatively, if it is determined in step 316 that the actual number of write operations measured does not exceed the preset maximum number of write operations or the actual time of write operation measured does not exceed the preset longest time of write operation, then the process transitions to step 302 and the information write operation is performed again.

In step 318 (S318), it is determined that the write operation fails for the page data in question and the FAIL information that indicates the failed write operation for the page data is stored in a register of the NAND-type flash memory (FAIL information storage). In this way, the write operation is performed. Upon completion of step 318, the process transitions to step 320.

In step 320 (S320), a determination is made as to whether the status read is "PASS". Specifically, the FAIL information stored in step 318 may be read, e.g., using a status read command. Thus, if the obtained result is "PASS" in step 306, and after the completion of step 314 or 318, then a status read command is sent to the NAND-type flash memory from a control device provided external to the NAND-type flash memory. Upon receipt of the command, the NAND-type flash memory returns it to the control device to convey such information that indicates the completion of the write operation at the NAND-type flash memory.

If the obtained result is "PASS" in step 320, then the write verify operation in the first page terminates. Alternatively, if the obtained result is "FAIL" in step 320, then the process transitions to step 322.

In step 322 (S322), defect correction is performed. Specifically, the page data determined as "FAIL" is rewritten with another page. Then, necessary operations are performed wherein the page determined as "FAIL" is processed as a defected page or a defected block, for example. Upon completion of step 322, the write verify operation in the first page terminates. Besides, the operations of steps 302 through 318 are performed at the NAND-type flash memory 51 illustrated in FIG. 8, while the operations of steps 320 and 322 are performed at the flash controller 53 as a memory controller illustrated in FIG. 8.

Figure 15:
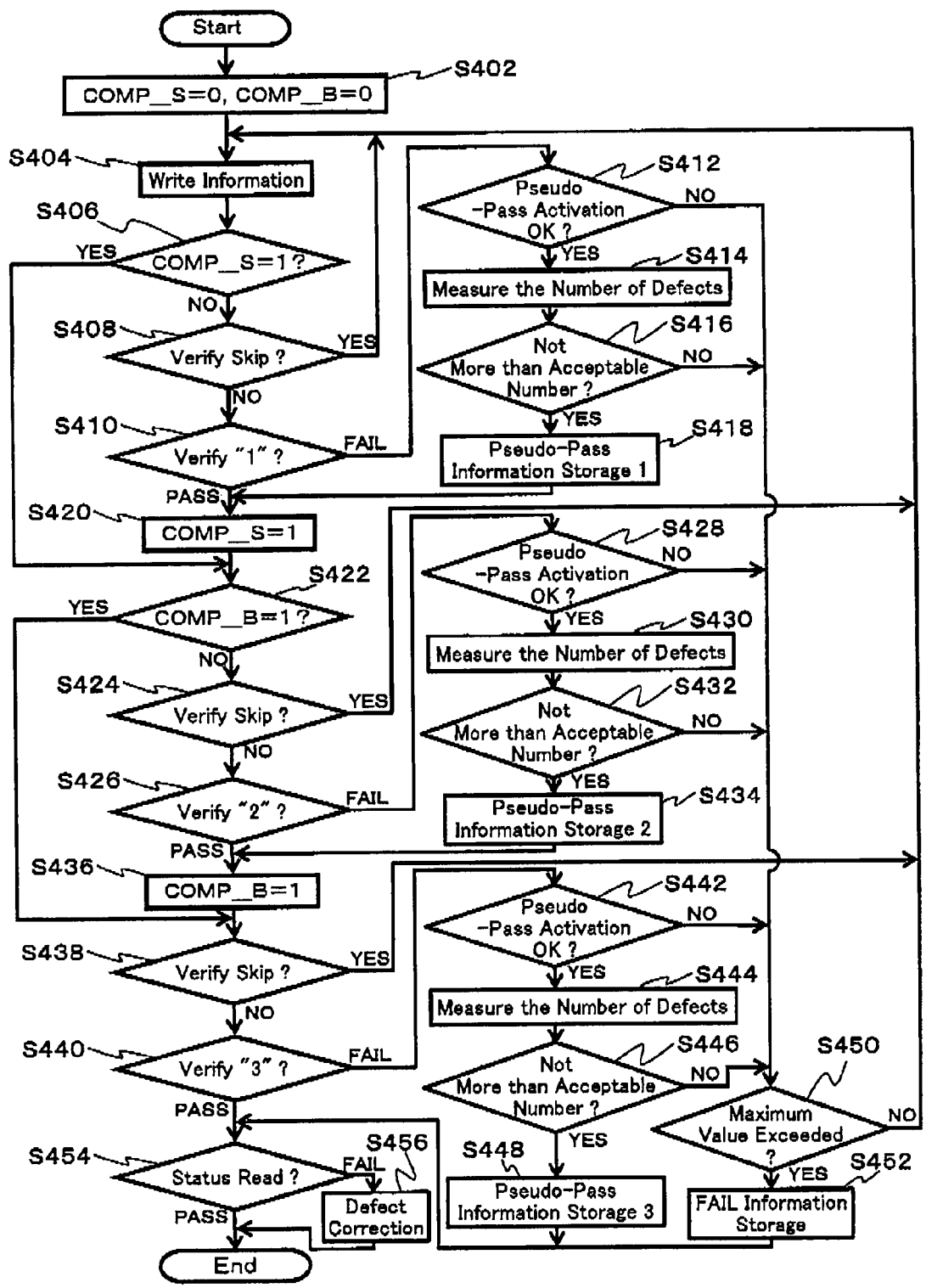
FIG. 15 is a flowchart of a write operation (2) according to the second embodiment.

A write verify operation in the second page will now be described below based on FIG. 15. Besides, in order to identify the write operation to be performed in the second page, the input signal UPPER is set to "1" and input to the selection-signal generation circuit 67.

Beginning in step 402 (S402), verification flags COMP_S and COMP_B are initialized in the register 20 of FIG. 1. Each of these signals indicates whether a verify read operation needs to be carried out on data in a corresponding memory cell. In this embodiment, COMP_S and COMP_B are both set to "0". This embodiment employs a scheme that begins a write operation with a distribution with lower threshold voltages. Therefore, COMP_S may be assigned as a signal that identifies a verify complete pass to the data "1" in the corresponding memory cell or that identifies the acceptable number of pseudo-passes not being exceeded, while COMP_B may be assigned as a signal that identifies a verify complete pass to the data "2" in the corresponding memory cell or that identifies the acceptable number of pseudo-passes not being exceeded.

Then, in step 404 (S404), information is written to the second page. Specifically, write pluses are applied to a memory cell depending on the information to be written and a write operation is performed thereto. Once the information being written, the application of voltage is terminated. Upon completion of step 404, the process transitions to step 406.

In step 406 (S406), a determination is made as to whether COMP_S is "1". If it is determined in step 406 that COMP_S is "1", then the process transitions to step 422. Alternatively, if it is determined in step 406 that COMP_S is not "1", i.e., if COMP_S is determined to be "0", then the process transitions to step 408.

In step 408 (S408), a determination is made as to whether a verify skip operation is to be performed or not. Specifically, the number of write pluses applied to the corresponding memory cell is measured by a counter. It is assumed that if the number of write pluses applied is not more than a predetermined value, then the verify skip operation is performed, otherwise the verify skip operation is not performed. If it is determined in step 408 that the verify skip operation is to be performed, then the process transitions to step 404. Alternatively, if it is determined in step 408 that the verify skip operation is not to be performed, then the process transitions to step 410.

In step 410 (S410), a verify read operation is performed at write level for the data "1" in the corresponding memory cell of the second page. Then, a determination is made as to whether the data "1" in all corresponding memory cells proves to be "PASS". Specifically, as illustrated in FIG. 7C, let "a'" be the potential of the word line (WL), a verify read is performed. As a result, if it is determined in step 410 that the data "1" in all corresponding memory cells proves to be "PASS", i.e., if they are determined to store data in normal state, then the process transitions to step 420. In step 410, if one or more of the memory cells are detected that do not store information in normal state, then those memory cells prove to be "FAIL" and the process transitions to step 412.

In step 412 (S412), a determination is made as to whether the pseudo-pass activation is "OK". Specifically, the amount of threshold-voltage shift is expected to be small at the beginning of the write operation to a memory cell in a page, and so is the number of memory cells that reach their verify levels to terminate their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 412 that the pseudo-pass activation is "OK", then the process transitions to step 414. Alternatively, if it is determined in step 412 that the pseudo-pass activation is "NO", then the process transitions to step 450.

In step 414 (S414), the number of verify fails, i.e., the number of defects, is measured. Upon completion of step 414, the process transitions to step 416.

In step 416 (S416), a determination is made as to whether the number of verify fails measured in step 414 is not more than the acceptable number of verify fails. In this case, the acceptable number of verify fails to be set is defined by a reference current Iref as illustrated in FIG. 10. The reference current Iref is set by selecting, as illustrated in FIG. 12, a register output signal BSPF_U1 for setting the acceptable number of pseudo-passes in write verify for data "1" in the second page based on a selection signal SEL at the selection circuit 66, outputting the signal BSPF_U1 as an output signal BSPF, and inputting it to the reference-current setting circuit 65.

Specifically, as illustrated in FIG. 12, in verifying data "1" in the second page, a register output signal BSPF_U1 is output as an output signal BSPF from the selection circuit 66, by inputting "1" as pvfyU1, "0" as pvfyU2, "0" as pvfyU3, and "1" as UPPER at the selection-signal generation circuit 67. Wherein, pvfyU1, pvfyU2 and pvfyU3 indicate when each turns to "1" that respective verify operations are being performed for the corresponding data "1", "2" and "3" in the second page.

If it is determined in step 416 that the number of verify fails is not more than the acceptable number of verify fails, then the process transitions to step 418. Alternatively, if it is determined in step 416 that the number of verify fails is more than, i.e., exceeds, the acceptable number, then the process transitions to step 450.

In step 418 (S418), such information is stored in a register of the pseudo-pass information storage 1 that indicates the verify operation being passed by way of the pseudo-pass. The stored information is configured so as to read, and determine, by way of known status read commands, whether the pseudo-pass results in success or not. Upon completion of step 418, the process transitions to step 420.

In step 420 (S420), as the data "1" in the corresponding memory cell being complete "PASS" or the number of verify fails not more than the acceptable number of verify fails in the verify operation, no verify read operation is required from then on for the data "1" in the corresponding memory cell. Thus, the value of COMP_S is changed to "1". Upon completion of step 420, the process transitions to step 422.

In step 422 (S422), a determination is made as to whether COMP_B is "1". If it is determined in step 422 that COMP_B is "1", then the process transitions to step 438. Alternatively, if it is determined in step 422 that COMP_B is not "1", i.e., if COMP_B is determined to be "0", then the process transitions to step 424.

In step 424 (S424), a determination is made as to whether a verify skip operation is to be performed or not. Specifically, the number of write pluses applied to the corresponding memory cell is measured by a counter. It is assumed that if the number of write pluses applied is not more than a predetermined value, then the verify skip operation is performed, otherwise the verify skip operation is not performed. If it is determined in step 424 that the verify skip operation is to be performed, then the process transitions to step 404. Alternatively, if it is determined in step 424 that the verify skip operation is not to be performed, then the process transitions to step 426.

In step 426 (5426), a verify read operation is performed at write level for the data "2" in the corresponding memory cell of the second page. Then, a determination is made as to whether the data "2" in all corresponding memory cells proves to be "PASS". Specifically, as illustrated in FIG. 7C, let "b'" be the potential of the word line (WL), a verify read is performed. As a result, if it is determined in step 426 that the data "2" in all corresponding memory cells proves to be "PASS", i.e., if they are determined to store data in normal state, then the process transitions to step 436. In step 426, if one or more of the memory cells are detected that do not store information in normal state, then those memory cells prove to be "FAIL" and the process transitions to step 428.

In step 428 (S428), a determination is made as to whether the pseudo-pass activation is "OK". Specifically, the amount of threshold-voltage shift is expected to be small at the beginning of the write operation to a memory cell in a page, and so is the number of memory cells that reach their verify levels to terminate their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 428 that the pseudo-pass activation is "OK", then the process transitions to step 430. Alternatively, if it is determined in step 428 that the pseudo-pass activation is "NO", then the process transitions to step 450.

In step 430 (S430), the number of verify fails, i.e., the number of defects, is measured. Upon completion of step 430, the process transitions to step 432.

In step 432 (S432), a determination is made as to whether the number of verify fails measured in step 430 is not more than the acceptable number of verify fails. In this case, the acceptable number of verify fails to be set is defined by a reference current Iref as illustrated in FIG. 10. The reference current Iref is set by selecting, as illustrated in FIG. 12, a register output signal BSPF_U2 for setting the acceptable number of pseudo-passes in write verify for data "2" in the second page based on a selection signal SEL at the selection circuit 66, outputting the signal BSPF_U2 as an output signal BSPF, and inputting it to the reference-current setting circuit 65.

Specifically, as illustrated in FIG. 12, in verifying data "2" in the second page, a register output signal BSPF_U2 is output as an output signal BSPF from the selection circuit 66, by inputting "0" as pvfyU1, "1" as pvfyU2, "0" as pvfyU3, and "1" as UPPER at the selection-signal generation circuit 67.

If it is determined in step 432 that the number of verify fails is not more than the acceptable number of verify fails, then the process transitions to step 434. Alternatively, if it is determined in step 432 that the number of verify fails is more than, i.e., exceeds, the acceptable number, then the process transitions to step 450.

In step 434 (S434), such information is stored in a register of the pseudo-pass information storage 2 that indicates the verify operation being passed by way of the pseudo-pass. The stored information is configured so as to read, and determine, by way of known status read commands, whether the pseudo-pass results in success or not. Upon completion of step 434, the process transitions to step 436.

In step 436 (S436), as the data "2" in the corresponding memory cell being complete "PASS" or the number of verify fails not more than the acceptable number of verify fails in the verify operation, no verify read operation is required from then on for the data "2" in the corresponding memory cell. Thus, the value of COMP_B is changed to "1". Upon completion of step 436, the process transitions to step 438.

In step 438 (S438), a determination is made as to whether a verify skip operation is to be performed or not. Specifically, the number of write pluses applied to the corresponding memory cell is measured by a counter. It is assumed that if the number of write pluses applied is not more than a predetermined value, then the verify skip operation is performed, otherwise the verify skip operation is not performed. If it is determined in step 438 that the verify skip operation is to be performed, then the process transitions to step 404. Alternatively, if it is determined in step 438 that the verify skip operation is not to be performed, then the process transitions to step 440.

In step 440 (S440), a verify read operation is performed at write level for the data "3" in the corresponding memory cell of the second page. Then, a determination is made as to whether the data "3" in all corresponding memory cells proves to be "PASS". Specifically, as illustrated in FIG. 7C, let "c" be the potential of the word line (WL), a verify read is performed. As a result, if it is determined in step 440 that the data "3" in all corresponding memory cells proves to be "PASS", i.e., if they are determined to store data in normal state, then the process transitions to step 454. In step 440, if one or more of the memory cells are detected that do not store information in normal state, then those memory cells prove to be "FAIL" and the process transitions to step 442.

In step 442 (S442), a determination is made as to whether the pseudo-pass activation is "OK". Specifically, the amount of threshold-voltage shift is expected to be small at the beginning of the write operation to a memory cell in a page, and so is the number of memory cells that reach their verify levels to terminate their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 442 that the pseudo-pass activation is "OK", then the process transitions to step 444. Alternatively, if it is determined in step 442 that the pseudo-pass activation is "NO", then the process transitions to step 450.

In step 444 (S444), the number of verify fails, i.e., the number of defects, is measured. Upon completion of step 444, the process transitions to step 446.

In step 446 (S446), a determination is made as to whether the number of verify fails measured in step 444 is not more than the acceptable number of verify fails. In this case, the acceptable number of verify fails to be set is defined by a reference current Iref as illustrated in FIG. 10. The reference current Iref is set by selecting, as illustrated in FIG. 12, a register output signal BSPF_U3 for setting the acceptable number of pseudo-passes in write verify for data "3" in the second page based on a selection signal SEL at the selection circuit 66, outputting the signal BSPF_U3 as an output signal BSPF, and inputting it to the reference-current setting circuit 65.

Specifically, as illustrated in FIG. 12, in verifying data "3" in the second page, a register output signal BSPF_U3 is output as an output signal BSPF from the selection circuit 66, by inputting "0" as pvfyU1, "0" as pvfyU2, "1" as pvfyU3, and "1" as UPPER at the selection-signal generation circuit 67.

If it is determined in step 446 that the number of verify fails is not more than the acceptable number of verify fails, then the process transitions to step 448. Alternatively, if it is determined in step 446 that the number of verify fails is more than, i.e., exceeds, the acceptable number, then the process transitions to step 450.

In step 448 (S448), such information is stored in a register of the pseudo-pass information storage 3 that indicates the verify operation being passed by way of the pseudo-pass. The stored information is configured so as to read, and determine, by way of known status read commands, whether the pseudo-pass results in success or not. Upon completion of step 448, the process transitions to step 454.

In step 450 (S450), a determination is made as to whether the number of write operations or the time of write operation exceeds the preset maximum number of write operations or the preset longest time of write operation. Specifically, the maximum number of write operations or the longest time of write operation is, for example, preset and stored in advance in the NAND-type flash memory according to this embodiment. These determinations are made by the comparison between the preset maximum number of write operations or the preset longest time of write operation and the actual number of write operations or the actual time of write operation. Besides, although not depicted in the drawing, the NAND-type flash memory according to this embodiment is provided with a counter for measuring the actual number of write operations or a timer for measuring the actual time of write operation. That counter or timer initiates and performs measurement of the number of write operations or the time of write operation.

If it is determined in step 450 that the actual number of write operations measured exceeds the preset maximum number of write operations or the actual time of write operation measured exceeds the preset longest time of write operation, then the process transitions to step 452. Alternatively, if it is determined in step 450 that the actual number of write operations measured does not exceed the preset maximum number of write operations or the actual time of write operation measured does not exceed the preset longest time of write operation, then the process transitions to step 404 and the information write operation is performed again.

In step 452 (S452), it is determined that the write operation fails for the page data in question and the FAIL information that indicates the failed write operation for the page data is stored in a register of the NAND-type flash memory (FAIL information storage). In this way, the write operation is performed. Upon completion of step 452, the process transitions to step 454.

In step 454 (S454), a determination is made as to whether the status read is "PASS". Specifically, the FAIL information stored in step 452 may be read, e.g., using a status read command. Thus, if the obtained result is "PASS" in step 440, and after the completion of step 448 or 452, then a status read command is sent to the NAND-type flash memory from a control device provided external to the NAND-type flash memory. Upon receipt of the command, the NAND-type flash memory returns it to the control device to convey such information that indicates the completion of the write operation at the NAND-type flash memory.

If the obtained result is "PASS" in step 454, then the write verify operation in the second page terminates. Alternatively, if the obtained result is "FAIL" in step 454, then the process transitions to step 456.

In step 456 (S456), defect correction is performed. Specifically, the page data determined as "FAIL" is rewritten with another page. Then, necessary operations are performed wherein the page determined as "FAIL" is processed as a defected page or a defected block, for example. Upon completion of step 456, the write verify operation in the second page terminates. Besides, the operations of steps 402 through 452 are performed at the NAND-type flash memory 51 illustrated in FIG. 8, while the operations of steps 454 and 456 are performed at the flash controller 53 as a memory controller illustrated in FIG. 8.

Third Embodiment

A third embodiment will now be described below. The third embodiment has a pseudo-pass setting fixed to zero for the data "2" in the corresponding memory cell of the second page of the first or second embodiment. Thus, only the complete PASS is permitted for the data "2" in the corresponding memory cell of the second page. The NAND-type flash memory according to this embodiment has the smaller amount of threshold-voltage shift in writing, for the data "2" in the corresponding memory cell of the second page, in comparison to each of data "2*" in the corresponding memory cell of the first page, data "1" in the corresponding memory cell of the second page, and data "3" in the corresponding memory cell. Therefore, it is likely that the complete PASS would be provided, and thus the number of pseudo-pass setting is set to "0" for the data "2" in the corresponding memory cell of the second page. This allows registers to be omitted that is used to store pseudo-pass information for the data "2" in the corresponding memory cell of the second page, which may mitigate circuit loads.

Figures 16, 17, 18:
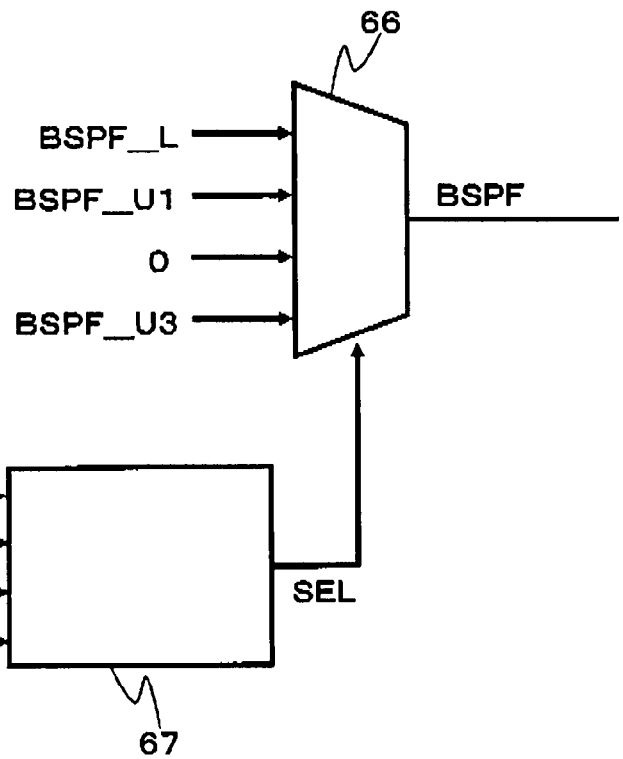
FIG. 16 is a configuration diagram for selection of register output signals according to a third embodiment.
FIG. 17 is a diagram illustrating a relationship between input signals and register output signals according to the third embodiment.
FIG. 18 is a diagram illustrating a relationship between input signals and register output signals according to a fourth embodiment.
Figure 19A:
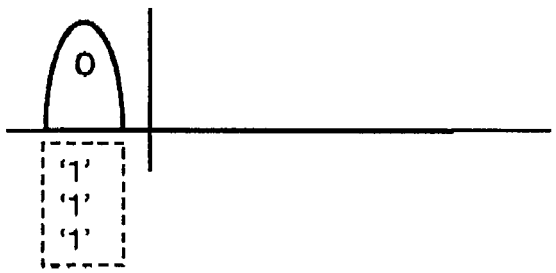
FIG. 19 is a diagram illustrating a relationship between data in a memory cell and a threshold according to a fifth embodiment.
Figure 19B:
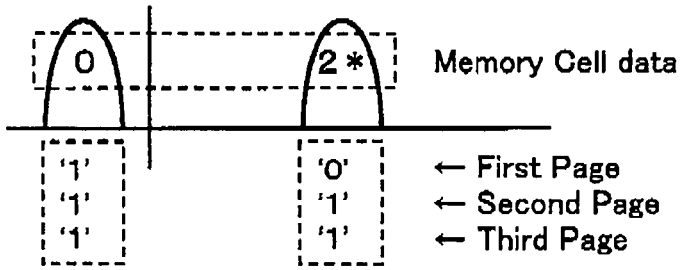
Figure 19C:
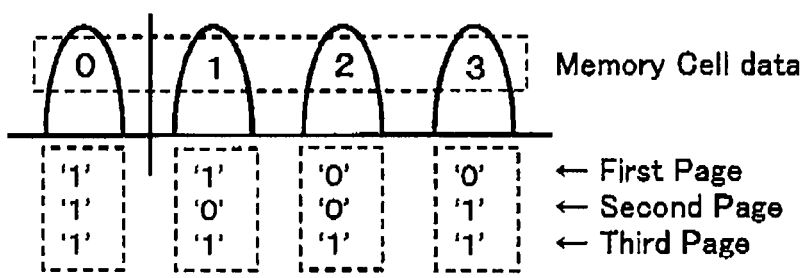
Figure 19D:
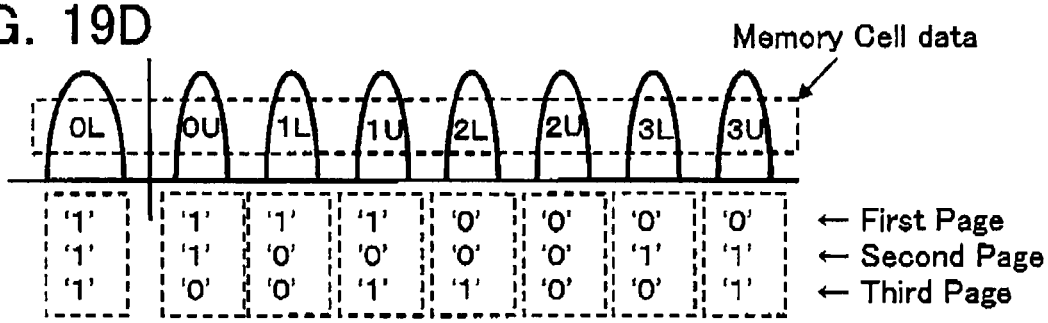

In explanation of this embodiment based on FIGS. 16 and FIG. 17, it is assumed that register output signals, each corresponding to data "2*" in the corresponding memory cell of the first page, data "1" in the corresponding memory cell of the second page, and data "3" in the corresponding memory cell of the second page, respectively, are similar to those in the first embodiment. If this embodiment is configured to assign 5 bits to BSPF, a register output signal corresponding to the data "2" in the corresponding memory cell of the second page is set to "0", and the number of pseudo-pass setting is set to "0" for the data "2" in the corresponding memory cell of the second page.

Fourth Embodiment

A fourth embodiment will now be described below. In the fourth embodiment, registers are further omitted from the third embodiment that is used to store pseudo-pass information, thereby mitigating circuit loads.

Specifically, for the purpose of storing binary data, an acceptable number of verify fails, which is acceptable for the data "1" in the corresponding memory cell of the second page, may probabilistically be set to the same number as an acceptable number of verify fails, which is acceptable for the data "3" in the corresponding memory cell of the second page. Therefore, it is desirable to set each acceptable number of pseudo-passes in verifying the data "1" and the data "3" in the second page, respectively to half the acceptable number of fails for the entire second page. Thus, the selection circuit 66 may be configured to output the value of the acceptable number of fails in the second page divided by two (2) as a respective acceptable number of verify fails for the data "1" in the corresponding memory cell of the second page and the data "3" in the corresponding memory cell. Specifically, in the context of binary data, if the embodiment is configured to assign 5 bits to BSPF, only the result of right-shift operation of BSPF_U1 by 1 bit may be output.

This allows registers to be omitted that is used to store pseudo-pass information for the data "1" or "3" in the corresponding memory cell of the second page, which may further mitigate circuit loads.

In explanation of this embodiment based on FIG. 18, it is assumed that register output signals corresponding to the first page are similar to those in the first embodiment. If the embodiment is configured to assign 5 bits to BSPF and BSPF_U1, respectively, a register output signal corresponding to memory cell data "1" in the second page is set to {1'b0, BSPF_U1 [5:1]}, which outputs a signal that is identically obtained from a right-shift operation by 1 bit; all register output signals corresponding to memory cell data "2" in the second page are set to "0"; and a register output signal corresponding to memory cell data "3" in the second page is set to {1'b0, BSPF_U1 [5:1]}, which outputs a signal that is identically obtained from a right-shift operation by 1 bit.

Fifth Embodiment

A fifth embodiment will now be described below. The fifth embodiment has a similar configuration of the NAND-type flash memory, etc., to the first or second embodiment. This embodiment relates to an eight-value storing operation that stores 3-bit information in one memory cell. Thus, how information is written to the first and second pages is similar to the first or second embodiment. Therefore, operations for writing information in a third page will be described below.

Operations of the NAND cell according to this embodiment will now be described below based on FIG. 19.

FIG. 19 illustrates a relationship between data in the corresponding memory cell and a threshold voltage in the memory cell. As illustrated in FIG. 19A, an erase operation is first performed and data is written to a first page. Then, as illustrated in FIG. 19B, states of data "0" and data "2*" are formed in the corresponding memory cell. Thereafter, upon data being written to the second page, as illustrated in FIG. 19C, states of data "0", data "1", data "2" and data "3", each having a threshold voltage inherent to the four-value storing operation, are formed in the corresponding memory cell. Further, upon data being written to a third page, as illustrated in FIG. 19 (d), states of data "0L", data "0H", data "1L", data "1H", data "2L", data "2H", data "3L" and data "3H", each having a threshold voltage inherent to the eight-value storing operation by 3 bits, are formed in the corresponding memory cell.

Figure 20A:
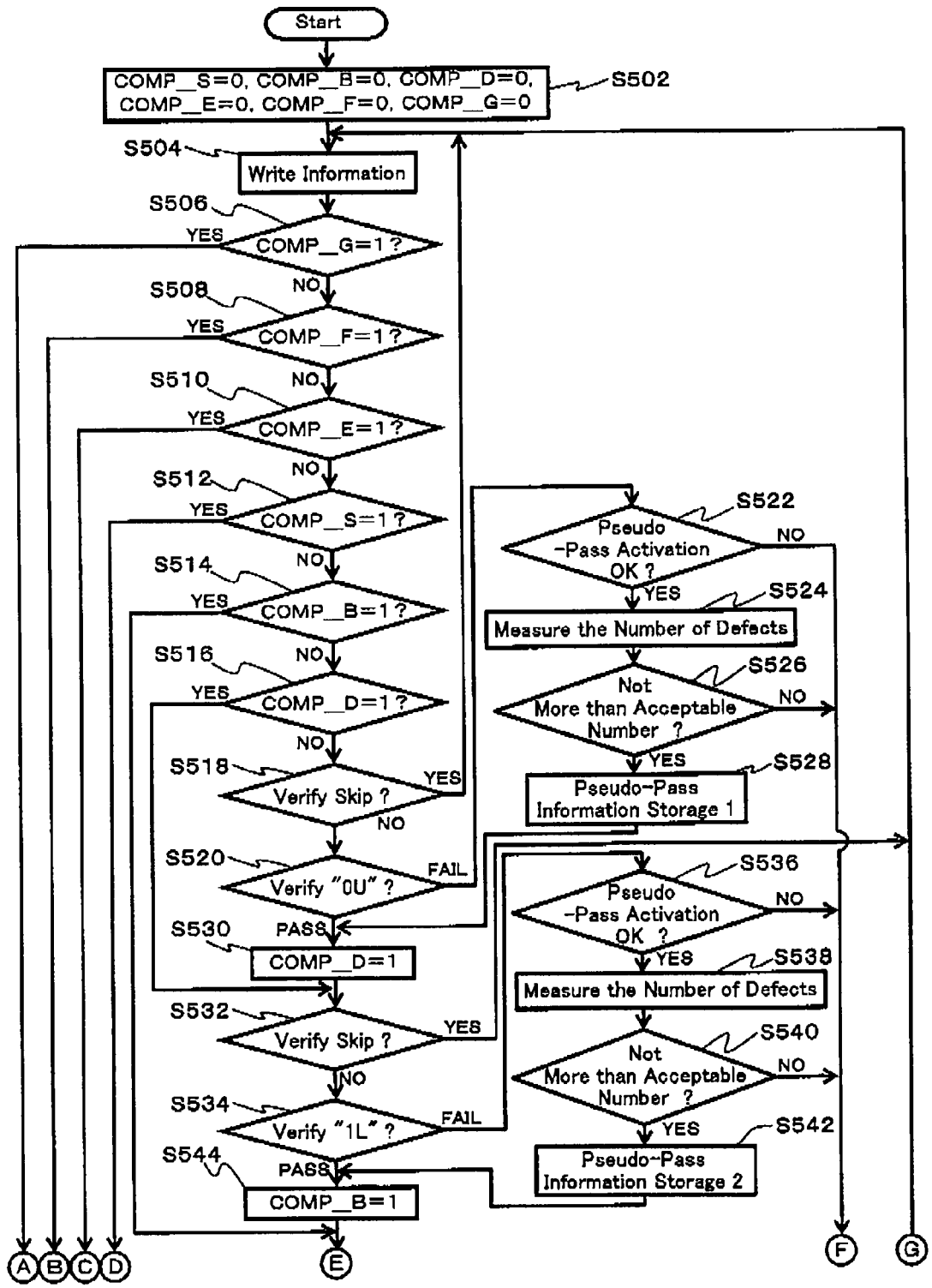
FIG. 20 is a flowchart illustrating a write operation according to the fifth embodiment.
Figure 20B:
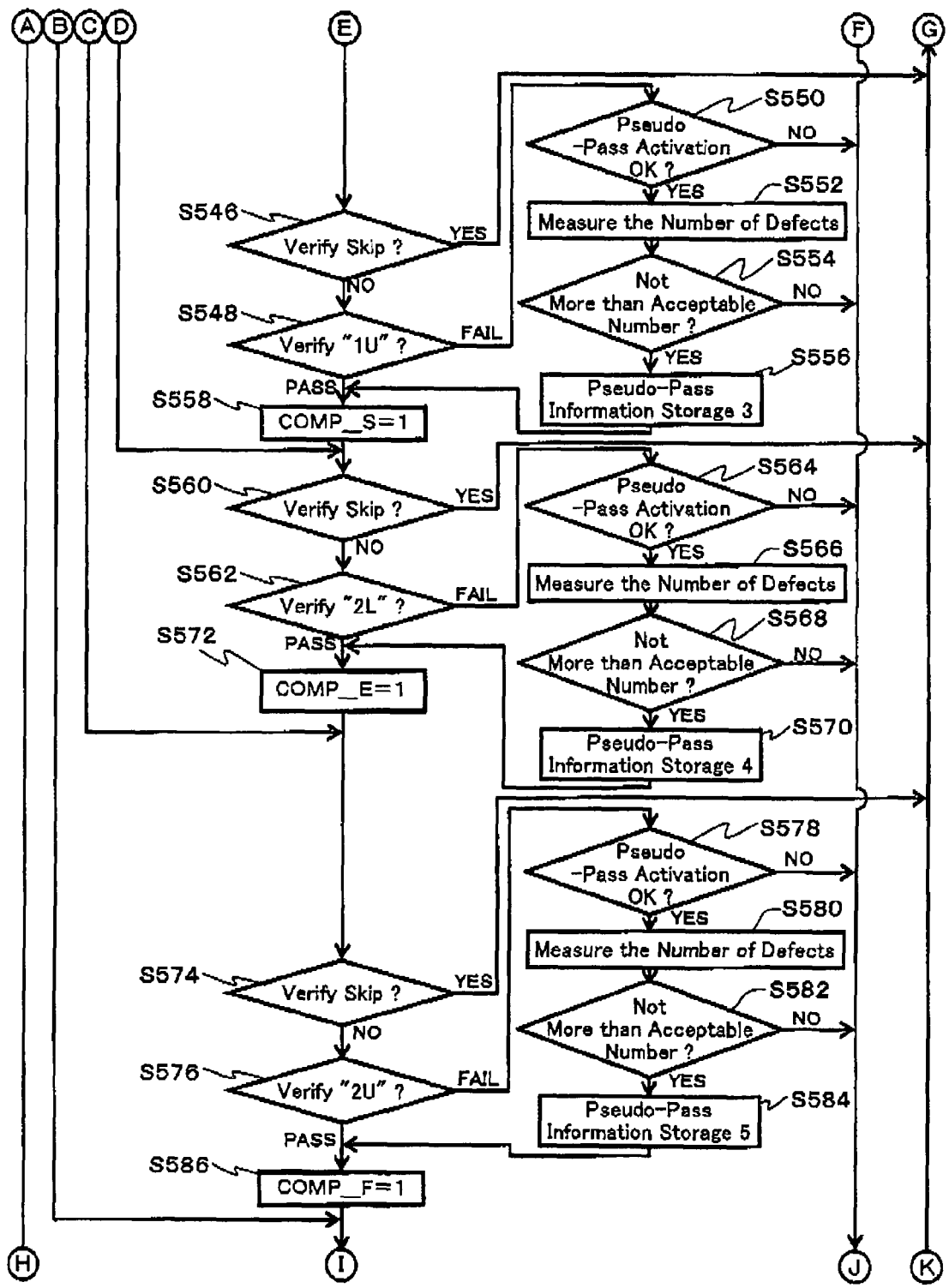
Figure 20C:
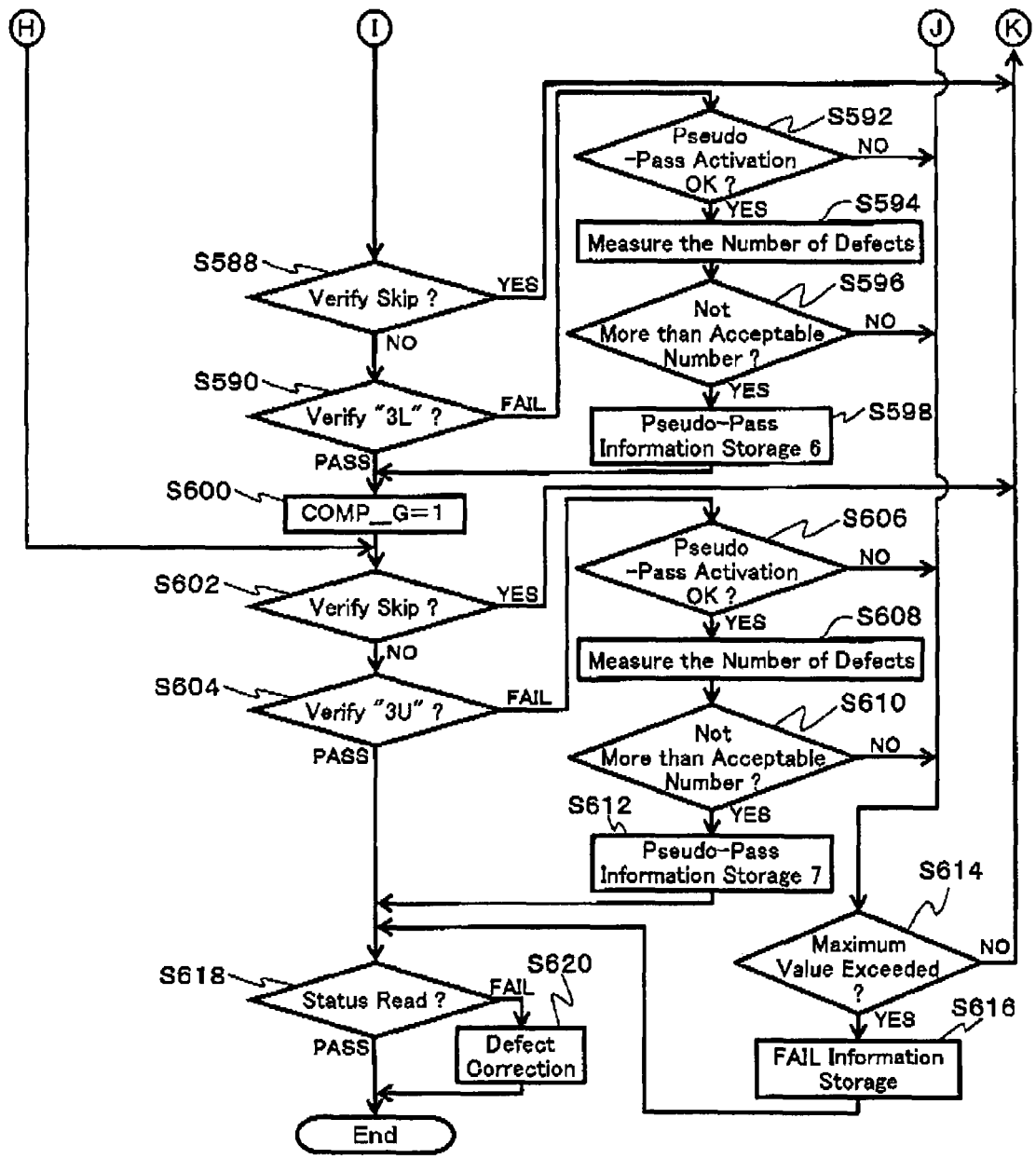
Figure 22:
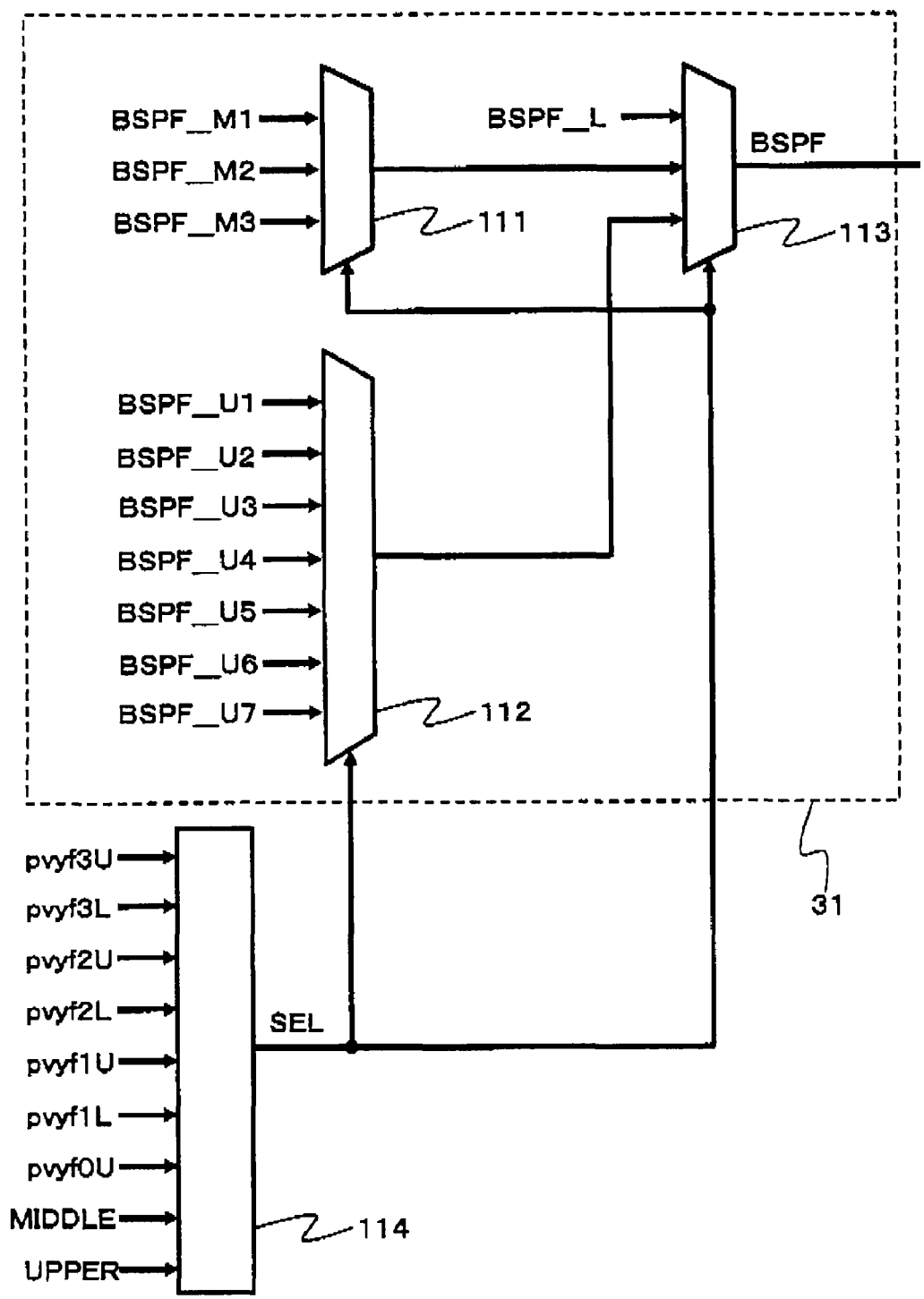
FIG. 22 is a configuration diagram for selection of register output signals according to the fifth embodiment.

A write verify operation in the third page according to this embodiment will now be described below based on FIGS. 20, 21 and 22. Besides, FIG. 20 includes FIGS. 20A, 20B and 20C. In this embodiment, as illustrated in FIG. 22, a first selection circuit 111, a second selection circuit 112, a third selection circuit 113 and a selection-signal generation circuit 114 are provided to perform a write verity operation to a memory cell with eight-value storage. The selection-signal generation circuit 114 has input signals of pvfy0U, pvfy1L, pvfy1U, pvfy2L, pvfy2U, pvfy3L, pvfy3U, MIDDLE, and UPPER. A selection signal SEL is generated and output based on the states of these signals. The setting of each input signal is as follows: pvfy0U is set to "1" during the verify operation for data "1" in the second page and data "0U" in the third page; pvfy1L is set to "1" during the verify operation for data "2" in the second page and data "1L" in the third page; pvfy1U is set to "1" during the verify operation for data "3" in the second page and data "1U" in the third page; pvfy2L is set to "1" during the verify operation for data "2L" in the third page; pvfy2U is set to "1" during the verify operation for data "2U" in the third page; pvfy3L is set to "1" during the verify operation for data "3L" in the third page; and pvfy3U is set to "1" during the verify operation for data "3U" in the third page. Upon the selection signal SEL being input to the first selection circuit 111, the second selection circuit 112 and the third selection circuit 113, a predetermined output is output accordingly. Connected to the first selection circuit 111 via respective buses are the following register output signals: BSPF_M1 for setting the acceptable number of pseudo-passes in write verify operation for data "1" in the second page; BSPF_M2 for setting the acceptable number of pseudo-passes in write verify operation for data "2" in the second page; and BSPF_M3 for setting the acceptable number of pseudo-passes in write verify operation for data "3" in the second page. Any one of these register output signals is output based on a selection signal SEL. The output register output signal is input to the third selection circuit 113 as a register output signal in the second page that is selected by the first selection circuit. Besides, each of BSPF_M1, BSPF_M2 and BSPF_M3 represents a respective signal in a respective bus.

Connected to the second selection circuit 112 via respective buses are the following register output signals: BSPF_U1 for setting the acceptable number of pseudo-passes in write verify for data "0U" in the third page; BSPF_U2 for setting the acceptable number of pseudo-passes in write verify for data "1L" in the third page; BSPF_U3 for setting the acceptable number of pseudo-passes in write verify for data "1U" in the third page; BSPF_U4 for setting the acceptable number of pseudo-passes in write verify for data "2L" in the third page; BSPF_U5 for setting the acceptable number of pseudo-passes in write verify for data "2U" in the third page; BSPF_U6 for setting the acceptable number of pseudo-passes in write verify for data "3L" in the third page; and BSPF_U7 for setting the acceptable number of pseudo-passes in write verify for data "3U" in the third page. Any one of these register output signals is output based on a selection signal SEL. The output register output signal is input to the third selection circuit 113 as a register output signal in the third page that is selected by the second selection circuit. Besides, each of BSPF_U1, BSPF_U2, BSPF_U3, BSPF_U4, BSPF_U5, BSPF_U6 and BSPF_U7 represents a respective signal in a respective bus.

Connected to the third selection circuit 113 via respective buses are the following signals: a register output signal BSPF_L for setting the acceptable number of pseudo-passes in write verify in the first page; a register output signal from the first selection circuit 111; and a register output signal from the second selection circuit 112. Any one of these register output signals is output based on a selection signal SEL. As in the case of FIG. 10, the output register output signal is input to the reference-current setting circuit 65, which in turn sets the predetermined acceptable number of pseudo-passes.

FIG. 21 illustrates a relationship between signals that are input to the selection-signal generation circuit 114 and register output signals that are selected by the third selection circuit 113 using selection signals SEL generated by the selection-signal generation circuit 114.

As illustrated in FIG. 21, in order to identify the write operation to be performed in the third page, the input signal UPPER is set to "1" and the input signal MIDDLE is set to "0", each of which is input to the selection-signal generation circuit 114. Besides, in order to identify the write operation to be performed in the first page, the input signal UPPER is set to "0" and the input signal MIDDLE is set to "0". In addition, in order to identify the write operation to be performed in the second page, the input signal UPPER is set to "0" and the input signal MIDDLE is set to "1".

Beginning in step 502 (S502), verification flags COMP_G, COMP_F, COMP_E, COMP_S, COMP_B and COMP_D are initialized in the register 20 of FIG. 1. In this embodiment, COMP_G, COMP_F, COMP_E, COMP_S, COMP_B and COMP_D are all set to "0". Each of these input signals indicates whether a verify read operation needs to be performed for respective data "3L", "2U", "2L", "1U", "1L" and "0U" in the third page.

Then, step 504 (S504), information is written to the third page. Specifically, write pluses are applied to a memory cell depending on the information to be written and a write operation is performed thereto. Once the information being written, the application of voltage is terminated. Upon completion of step 504, the process transitions to step 506.

In step 506 (S506), a determination is made as to whether COMP_G is "1". If it is determined in step 506 that COMP_G is "1", then the process transitions to step 602. Alternatively, if it is determined in step 506 that COMP_G is not "1", i.e., if COMP_G is determined to be "0", then the process transitions to step 508.

In step 508 (S508), a determination is made as to whether COMP_F is "1". If it is determined in step 508 that COMP_F is "1", then the process transitions to step 588. Alternatively, if it is determined in step 508 that COMP_F is not "1", i.e., if COMP_F is determined to be "0", then the process transitions to step 510.

In step 510 (S510), a determination is made as to whether COMP_E is "1". If it is determined in step 510 that COMP_E is "1", then the process transitions to step 574. Alternatively, if it is determined in step 510 that COMP_E is not "1", i.e., if COMP_E is determined to be "0", then the process transitions to step 512.

In step 512 (S512), a determination is made as to whether COMP_S is "1". If it is determined in step 512 that COMP_S is "1", then the process transitions to step 560. Alternatively, if it is determined in step 512 that COMP_S is not "1", i.e., if COMP_S is determined to be "0", then the process transitions to step 514.

In step 514 (S514), a determination is made as to whether COMP_B is "1". If it is determined in step 514 that COMP_B is "1", then the process transitions to step 546. Alternatively, if it is determined in step 514 that COMP_B is not "1", i.e., if COMP_B is determined to be "0", then the process transitions to step 516.

In step 516 (S516), a determination is made as to whether COMP_D is "1". If it is determined in step 516 that COMP_D is "1", then the process transitions to step 532. Alternatively, if it is determined in step 516 that COMP_B is not "1", i.e., if COMP_B is determined to be "0", then the process transitions to step 518.

In step 518 (S518), a determination is made as to whether a verify skip operation is to be performed or not. Specifically, the number of write pluses applied to the corresponding memory cell is measured by a counter. It is assumed that if the number of write pluses applied is not more than a predetermined value, then the verify skip operation is performed, otherwise the verify skip operation is not performed. If it is determined in step 518 that the verify skip operation is to be performed, then the process transitions to step 504. Alternatively, if it is determined in step 518 that the verify skip operation is not to be performed, then the process transitions to step 520.

In step 520 (S520), a verify read operation is performed at write level for the data "0U" in the corresponding memory cell of the third page. Then, a determination is made as to whether the data "0U" in all corresponding memory cells proves to be "PASS". As a result, if it is determined in step 520 that the data "0U" in all corresponding memory cells proves to be "PASS", i.e., if they are determined to store data in normal state, then the process transitions to step 530. In step 520, if one or more of the memory cells are detected that do not store information in normal state, then those memory cells prove to be "FAIL" and the process transitions to step 522.

In step 522 (S522), a determination is made as to whether the pseudo-pass activation is "OK". Specifically, the amount of threshold-voltage shift is expected to be small at the beginning of the write operation to a memory cell in a page, and so is the number of memory cells that reach their verify levels to terminate their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 522 that the pseudo-pass activation is "OK", then the process transitions to step 524. Alternatively, if it is determined in step 522 that the pseudo-pass activation is "NO", then the process transitions to step 614.

In step 524 (S524), the number of verify fails, i.e., the number of defects, is measured. Upon completion of step 524, the process transitions to step 526.

In step 526 (S526), a determination is made as to whether the number of verify fails measured in step 524 is not more than the acceptable number of verify fails. In this case, the acceptable number of verify fails to be set is defined by a reference current Iref. The reference current Iref is set by selecting, as illustrated in FIG. 22, a register output signal BSPF_U1 for setting the acceptable number of pseudo-passes in write verify for data "0U" in the third page, at the first selection circuit 111, the second selection circuit 112, and the third selection circuit 113, each based on a selection signal SEL generated by the selection-signal generation circuit 114, outputting the signal BSPF_U1 as an output signal BSPF, and inputting it to the reference-current setting circuit.

Specifically, as illustrated in FIG. 21, in verifying data "0U" in the third page, a register output signal BSPF_U1 is output as an output signal BSPF from the third selection circuit 113, by inputting "1" as pvfy0U, "0" as pvfy1L, "0" as pvfy1U, "0" as pvfy2L, "0" as pvfy2U, "0" as pvfy3L, "0" as pvfy3U, "0" as MIDDLE, and "1" as UPPER at the selection-signal generation circuit 114.

If it is determined in step 526 that the number of verify fails is not more than the acceptable number of verify fails, then the process transitions to step 528. Alternatively, if it is determined in step 526 that the number of verify fails is more than, i.e., exceeds, the acceptable number, then the process transitions to step 614.

In step 528 (S528), such information is stored in a register of the pseudo-pass information storage 1 that indicates the verify operation being passed by way of the pseudo-pass. The stored information is configured so as to read, and determine, by way of known status read commands, whether the pseudo-pass results in success or not. Upon completion of step 528, the process transitions to step 530.

In step 530 (S530), as data "0U" in the corresponding memory cell being complete "PASS" or the number of verify fails not more than the acceptable number of verify fails in the verify operation, no verify read operation is required from then on for the data "0U" in the corresponding memory cell. Thus, the value of COMP_D is changed to "1". Upon completion of step 530, the process transitions to step 532.

In step 532 (S532), a determination is made as to whether a verify skip operation is to be performed or not. Specifically, the number of write pluses applied to the corresponding memory cell is measured by a counter. It is assumed that if the number of write pluses applied is not more than a predetermined value, then the verify skip operation is performed, otherwise the verify skip operation is not performed. If it is determined in step 532 that the verify skip operation is to be performed, then the process transitions to step 504. Alternatively, if it is determined in step 532 that the verify skip operation is not to be performed, then the process transitions to step 534.

In step 534 (S534), a verify read operation is performed at write level for the data "1L" in the corresponding memory cell of the third page. Then, a determination is made as to whether the data "1L" in all corresponding memory cells proves to be "PASS". As a result, if it is determined in step 534 that the data "1L" in all corresponding memory cells proves to be "PASS", i.e., if they are determined to store data in normal state, then the process transitions to step 544. In step 534, if one or more of the memory cells are detected that do not store information in normal state, then those memory cells prove to be "FAIL" and the process transitions to step 536.

In step 536 (S536), a determination is made as to whether the pseudo-pass activation is "OK". Specifically, the amount of threshold-voltage shift is expected to be small at the beginning of the write operation to a memory cell in a page, and so is the number of memory cells that reach their verify levels to complete their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 536 that the pseudo-pass activation is "OK", then the process transitions to step 538. Alternatively, if it is determined in step 536 that the pseudo-pass activation is "NO", then the process transitions to step 614.

In step 538 (S538), the number of verify fails, i.e., the number of defects, is measured. Upon completion of step 538, the process transitions to step 540.

In step 540 (S540), a determination is made as to whether the number of verify fails measured in step 538 is not more than the acceptable number of verify fails. In this case, the acceptable number of verify fails to be set is defined by a reference current Iref. The reference current Iref is set by selecting, as illustrated in FIG. 22, a register output signal BSPF_U2 for setting the acceptable number of pseudo-passes in write verify for data "1L" in the third page, at the first selection circuit 111, the second selection circuit 112, and the third selection circuit 113, each based on a selection signal SEL generated by the selection-signal generation circuit 114, outputting the signal BSPF_U2 as an output signal BSPF, and inputting it to the reference-current setting circuit.

Specifically, as illustrated in FIG. 21, in verifying data "1L" in the third page, a register output signal BSPF_U2 is output as an output signal BSPF from the third selection circuit 113, by inputting "0" as pvfy0U, "1" as pvfy1L, "0" as pvfy1U, "0" as pvfy2L, "0" as pvfy2U, "0" as pvfy3L, "0" as pvfy3U, "0" as MIDDLE, and "1" as UPPER at the selection-signal generation circuit 114.

If it is determined in step 540 that the number of verify fails is not more than the acceptable number of verify fails, then the process transitions to step 542. Alternatively, if it is determined in step 540 that the number of verify fails is more than, i.e., exceeds, the acceptable number, then the process transitions to step 614.

In step 542 (S542), such information is stored in a register of the pseudo-pass information storage 2 that indicates the verify operation being passed by way of the pseudo-pass. The stored information is configured so as to read, and determine, by way of known status read commands, whether the pseudo-pass results in success or not. Upon completion of step 542, the process transitions to step 544.

In step 544 (S544), as the data "1L" in the corresponding memory cell being complete "PASS" or the number of verify fails not more than the acceptable number of verify fails in the verify operation, no verify read operation is required from then on for the data "1L" in the corresponding memory cell. Thus, the value of COMP_B is changed to "1". Upon completion of step 544, the process transitions to step 546.

In step 546 (S546), a determination is made as to whether a verify skip operation is to be performed or not. Specifically, the number of write pluses applied to the corresponding memory cell is measured by a counter. It is assumed that if the number of write pluses applied is not more than a predetermined value, then the verify skip operation is performed, otherwise the verify skip operation is not performed. If it is determined in step 546 that the verify skip operation is to be performed, then the process transitions to step 504. Alternatively, if it is determined in step 546 that the verify skip operation is not to be performed, then the process transitions to step 548.

In step 548 (S548), a verify read operation is performed at write level for the data "1U" in the corresponding memory cell of the third page. Then, a determination is made as to whether the data "1U" in all corresponding memory cells proves to be "PASS". As a result, if it is determined in step 548 that the data "1U" in all corresponding memory cells proves to be "PASS", i.e., if they are determined to store data in normal state, then the process transitions to step 558. In step 548, if one or more of the memory cells are detected that do not store information in normal state, then those memory cells prove to be "FAIL" and the process transitions to step 550.

In step 550 (S550), a determination is made as to whether the pseudo-pass activation is "OK". Specifically, the amount of threshold-voltage shift is expected to be small at the beginning of the write operation to a memory cell in a page, and so is the number of memory cells that reach their verify levels to complete their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 550 that the pseudo-pass activation is "OK", then the process transitions to step 552. Alternatively, if it is determined in step 550 that the pseudo-pass activation is "NO", then the process transitions to step 614.

In step 552 (S552), the number of verify fails, i.e., the number of defects, is measured. Upon completion of step 552, the process transitions to step 554.

In step 554 (S554), a determination is made as to whether the number of verify fails measured in step 552 is not more than the acceptable number of verify fails. In this case, the acceptable number of verify fails to be set is defined by a reference current Iref. The reference current Iref is set by selecting, as illustrated in FIG. 22, a register output signal BSPF_U3 for setting the acceptable number of pseudo-passes in write verify for data "1U" in the third page, at the first selection circuit 111, the second selection circuit 112, and the third selection circuit 113, each based on a selection signal SEL generated by the selection-signal generation circuit 114, outputting the signal BSPF_U3 as an output signal BSPF, and inputting it to the reference-current setting circuit.

Specifically, as illustrated in FIG. 21, in verifying data "1U" in the third page, a register output signal BSPF_U3 is output as an output signal BSPF from the third selection circuit 113, by inputting "0" as pvfy0U, "0" as pvfy1L, "1" as pvfy1U, "0" as pvfy2L, "0" as pvfy2U, "0" as pvfy3L, "0" as pvfy3U, "0" as MIDDLE, and "1" as UPPER at the selection-signal generation circuit 114.

If it is determined in step 554 that the number of verify fails is not more than the acceptable number of verify fails, then the process transitions to step 556. Alternatively, if it is determined in step 554 that the number of verify fails is more than, i.e., exceeds, the acceptable number, then the process transitions to step 614.

In step 556 (S556), such information is stored in a register of the pseudo-pass information storage 3 that indicates the verify operation being passed by way of the pseudo-pass. The stored information is configured so as to read, and determine, by way of known status read commands, whether the pseudo-pass results in success or not. Upon completion of step 556, the process transitions to step 558.

In step 558 (S558), as the data "1U" in the corresponding memory cell being complete "PASS" or the number of verify fails not more than the acceptable number of verify fails in the verify operation, no verity read operation is required from then on for the data "1U" in the corresponding memory cell. Thus, the value of COMP_S is changed to "1". Upon completion of step 558, the process transitions to step 560.

In step 560 (S560), a determination is made as to whether a verify skip operation is to be performed or not. Specifically, the number of write pluses applied to the corresponding memory cell is measured by a counter. It is assumed that if the number of write pluses applied is not more than a predetermined value, then the verify skip operation is performed, otherwise the verify skip operation is not performed. If it is determined in step 560 that the verify skip operation is to be performed, then the process transitions to step 504. Alternatively, if it is determined in step 560 that the verify skip operation is not to be performed, then the process transitions to step 562.

In step 562 (S562), a verify read operation is performed at write level for the data "2L" in the corresponding memory cell of the third page. Then, a determination is made as to whether the data "2L" in all corresponding memory cells proves to be "PASS". As a result, if it is determined in step 562 that the data "2L" in all corresponding memory cells proves to be "PASS", i.e., if they are determined to store data in normal state, then the process transitions to step 572. In step 562, if one or more of the memory cells are detected that do not store information in normal state, then those memory cells prove to be "FAIL" and the process transitions to step 564.

In step 564 (S564), a determination is made as to whether the pseudo-pass activation is "OK". Specifically, the amount of threshold-voltage shift is expected to be small at the beginning of the write operation to a memory cell in a page, and so is the number of memory cells that reach their verify levels to complete their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 564 that the pseudo-pass activation is "OK", then the process transitions to step 566. Alternatively, if it is determined in step 564 that the pseudo-pass activation is "NO", then the process transitions to step 614.

In step 566 (S566), the number of verify fails, i.e., the number of defects, is measured. Upon completion of step 566, the process transitions to step 568.

In step 568 (S568), a determination is made as to whether the number of verify fails measured in step 566 is not more than the acceptable number of verify fails. In this case, the acceptable number of verify fails to be set is defined by a reference current Iref. The reference current Iref is set by selecting, as illustrated in FIG. 22, a register output signal BSPF_U4 for setting the acceptable number of pseudo-passes in write verify for data "2L" in the third page, at the first selection circuit 111, the second selection circuit 112, and the third selection circuit 113, each based on a selection signal SEL generated by the selection-signal generation circuit 114, outputting the signal BSPF_U4 as an output signal BSPF, and inputting it to the reference-current setting circuit.

Specifically, as illustrated in FIG. 21, in verifying data "2L" in the third page, a register output signal BSPF_U4 is output as an output signal BSPF from the third selection circuit 113, by inputting "0" as pvfy0U, "0" as pvfy1L, "0" as pvfy1U, "1" as pvfy2L, "0" as pvfy2U, "0" as pvfy3L, "0" as pvfy3U, "0" as MIDDLE, and "1" as UPPER at the selection-signal generation circuit 114.

If it is determined in step 568 that the number of verify fails is not more than the acceptable number of verify fails, then the process transitions to step 570. Alternatively, if it is determined in step 568 that the number of verify fails is more than, i.e., exceeds, the acceptable number, then the process transitions to step 614.

In step 570 (S570), such information is stored in a register of a pseudo-pass information storage 4 that indicates the verify operation being passed by way of the pseudo-pass. The stored information is configured so as to read, and determine, by way of known status read commands, whether the pseudo-pass results in success or not. Upon completion of step 570, the process transitions to step 572.

In step 572 (S572), as the data "2L" in the corresponding memory cell being complete "PASS" or the number of verify fails not more than the acceptable number of verify fails, no verify read operation is required from then on for the data "2L" in the corresponding memory cell. Thus, the value of COMP_E is changed to "1". Upon completion of step 572, the process transitions to step 574.

In step 574 (S574), a determination is made as to whether a verify skip operation is to be performed or not. Specifically, the number of write pluses applied to the corresponding memory cell is measured by a counter. It is assumed that if the number of write pluses applied is not more than a predetermined value, then the verify skip operation is performed, otherwise the verify skip operation is not performed. If it is determined in step 574 that the verify skip operation is to be performed, then the process transitions to step 504. Alternatively, if it is determined in step 574 that the verify skip operation is not to be performed, then the process transitions to step 576.

In step 576 (S576), a verify read operation is performed at write level for the data "2U" in the corresponding memory cell of the third page. Then, a determination is made as to whether the data "2U" in all corresponding memory cells proves to be "PASS". As a result, if it is determined in step 576 that the data "2U" in all corresponding memory cells proves to be "PASS", i.e., if they are determined to store data in normal state, then the process transitions to step 586. In step 576, if one or more of the memory cells are detected that do not store information in normal state, then those memory cells prove to be "FAIL" and the process transitions to step 578.

In step 578 (S578), a determination is made as to whether the pseudo-pass activation is "OK". Specifically, the amount of threshold-voltage shift is expected to be small at the beginning of the write operation to a memory cell in a page, and so is the number of memory cells that reach their verify levels to complete their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 578 that the pseudo-pass activation is "OK", then the process transitions to step 580. Alternatively, if it is determined in step 578 that the pseudo-pass activation is "NO", then the process transitions to step 614.

In step 580 (S580), the number of verify fails, i.e., the number of defects, is measured. Upon completion of step 580, the process transitions to step 582.

In step 582 (S582), a determination is made as to whether the number of verify fails measured in step 580 is not more than the acceptable number of verify fails. In this case, the acceptable number of verify fails to be set is defined by a reference current Iref. The reference current Iref is set by selecting, as illustrated in FIG. 22, a register output signal BSPF_U5 for setting the acceptable number of pseudo-passes in write verify for data "2U" in the third page, at the first selection circuit 111, the second selection circuit 112, and the third selection circuit 113, each based on a selection signal SEL generated by the selection-signal generation circuit 114, outputting the signal BSPF_U5 as an output signal BSPF, and inputting it to the reference-current setting circuit.

Specifically, as illustrated in FIG. 21, in verifying data "2U" in the third page, a register output signal BSPF_U5 is output as an output signal BSPF from the third selection circuit 113, by inputting "0" as pvfy0U, "0" as pvfy1L, "0" as pvfy1U, "0" as pvfy2L, "1" as pvfy2U, "0" as pvfy3L, "0" as pvfy3U, "0" as MIDDLE, and "1" as UPPER at the selection-signal generation circuit 114.

If it is determined in step 582 that the number of verify fails is not more than the acceptable number of verify fails, then the process transitions to step 584. Alternatively, if it is determined in step 582 that the number of verify fails is more than, i.e., exceeds, the acceptable number, then the process transitions to step 614.

In step 584 (S584), such information is stored in a register of a pseudo-pass information storage 5 that indicates the verify operation being passed by way of the pseudo-pass. The stored information is configured so as to read, and determine, by way of known status read commands, whether the pseudo-pass results in success or not. Upon completion of step 584, the process transitions to step 586.

In step 586 (S586), as the data "2U" in the corresponding memory cell being complete "PASS" or the number of verify fails not more than the acceptable number of verify fails in the verify operation, no verify read operation is required from then on for the data "2U" in the corresponding memory cell. Thus, the value of COMP_F is changed to "1". Upon completion of step 586, the process transitions to step 588.

In step 588 (S588), a determination is made as to whether a verify skip operation is to be performed or not. Specifically, the number of write pluses applied to the corresponding memory cell is measured by a counter. It is assumed that if the number of write pluses applied is not more than a predetermined value, then the verify skip operation is performed, otherwise the verify skip operation is not performed. If it is determined in step 588 that the verify skip operation is to be performed, then the process transitions to step 504. Alternatively, if it is determined in step 588 that the verify skip operation is not to be performed, then the process transitions to step 590.

In step 590 (S590), a verify read operation is performed at write level for the data "3L" in the corresponding memory cell of the third page. Then, a determination is made as to whether the data "3L" in all corresponding memory cells proves to be "PASS". As a result, if it is determined in step 590 that the data "3L" in all corresponding memory cells proves to be "PASS", i.e., if they are determined to store data in normal state, then the process transitions to step 600. In step 590, if one or more of the memory cells are detected that do not store information in normal state, then those memory cells prove to be "FAIL" and the process transitions to step 592.

In step 592 (S592), a determination is made as to whether the pseudo-pass activation is "OK". Specifically, the amount of threshold-voltage shift is expected to be small at the beginning of the write operation to a memory cell in a page, and so is the number of memory cells that reach their verify levels to complete their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 592 that the pseudo-pass activation is "OK", then the process transitions to step 594. Alternatively, if it is determined in step 592 that the pseudo-pass activation is "NO", then the process transitions to step 614.

In step 594 (S594), the number of verify fails, i.e., the number of defects, is measured. Upon completion of step 594, the process transitions to step 596.

In step 596 (S596), a determination is made as to whether the number of verify fails measured in step 594 is not more than the acceptable number of verify fails. In this case, the acceptable number of verify fails to be set is defined by a reference current Iref. The reference current Iref is set by selecting, as illustrated in FIG. 22, a register output signal BSPF_U6 for setting the acceptable number of pseudo-passes in write verify for data "3L" in the third page, at the first selection circuit 111, the second selection circuit 112, and the third selection circuit 113, each based on a selection signal SEL generated by the selection-signal generation circuit 114, outputting the signal BSPF_U6 as an output signal BSPF, and inputting it to the reference-current setting circuit.

Specifically, as illustrated in FIG. 21, in verifying data "3L" in the third page, a register output signal BSPF_U6 is output as an output signal BSPF from the third selection circuit 113, by inputting "0" as pvfy0U, "0" as pvfy1L, "0" as pvfy1U, "0" as pvfy2L, "0" as pvfy2U, "1" as pvfy3L, "0" as pvfy3U, "0" as MIDDLE, and "1" as UPPER at the selection-signal generation circuit 114.

If it is determined in step 596 that the number of verify fails is not more than the acceptable number of verify fails, then the process transitions to step 598. Alternatively, if it is determined in step 596 that the number of verify fails is more than, i.e., exceeds, the acceptable number, then the process transitions to step 614.

In step 598 (S598), such information is stored in a register of a pseudo-pass information storage 6 that indicates the verify operation being passed by way of the pseudo-pass. The stored information is configured so as to read, and determine, by way of known status read commands, whether the pseudo-pass results in success or not. Upon completion of step 598, the process transitions to step 600.

In step 600 (S600), as the data "3L" in the corresponding memory cell being complete "PASS" or the number of verify fails not more than the acceptable number of verify fails in the verify operation, no verify read operation is required from then on for the data "3L" in the corresponding memory cell. Thus, the value of COMP_G is changed to "1". Upon completion of step 600, the process transitions to step 602.

In step 602 (S602), a determination is made as to whether a verify skip operation is to be performed or not. Specifically, the number of write pluses applied to the corresponding memory cell is measured by a counter. It is assumed that if the number of write pluses applied is not more than a predetermined value, then the verify skip operation is performed, otherwise the verify skip operation is not performed. If it is determined in step 602 that the verify skip operation is to be performed, then the process transitions to step 504. Alternatively, if it is determined in step 602 that the verify skip operation is not to be performed, then the process transitions to step 604.

In step 604 (S604), a verify read operation is performed at write level for the data "3U" in the corresponding memory cell of the third page. Then, a determination is made as to whether the data "3U" in all corresponding memory cells proves to be "PASS". As a result, if it is determined in step 604 that the data "3U" in all corresponding memory cells proves to be "PASS", i.e., if they are determined to store data in normal state, then the process transitions to step 618. In step 604, if one or more of the memory cells are detected that do not store information in normal state, then those memory cells prove to be "FAIL" and the process transitions to step 606.

In step 606 (S606), a determination is made as to whether the pseudo-pass activation is "OK". Specifically, the amount of threshold-voltage shift is expected to be small at the beginning of the write operation to a memory cell in a page, and so is the number of memory cells that reach their verify levels to complete their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is determined, by compulsion, to be not "OK". If it is determined in step 606 that the pseudo-pass activation is "OK", then the process transitions to step 608. Alternatively, if it is determined in step 606 that the pseudo-pass activation is "NO", then the process transitions to step 614.

In step 608 (S608), the number of verify fails, i.e., the number of defects, is measured. Upon completion of step 608, the process transitions to step 610.

In step 610 (S610), a determination is made as to whether the number of verify fails measured in step 608 is not more than the acceptable number of verify fails. In this case, the acceptable number of verify fails to be set is defined by a reference current Iref. The reference current Iref is set by selecting, as illustrated in FIG. 22, a register output signal BSPF_U7 for setting the acceptable number of pseudo-passes in write verify for data "3U" in the third page, based on a selection signal SEL generated by the selection-signal generation circuit 114, outputting the signal BSPF_U7 as an output signal BSPF, and inputting it to the reference-current setting circuit.

Specifically, as illustrated in FIG. 21, in verifying data "3U" in the third page, a register output signal BSPF_U7 is output as an output signal BSPF from the third selection circuit 113, by inputting "0" as pvfy0U, "0" as pvfy1L, "0" as pvfy1U, "0" as pvfy2L, "0" as pvfy2U, "0" as pvfy3L, "1" as pvfy3U, "0" as MIDDLE, and "1" as UPPER at the selection-signal generation circuit 114.

If it is determined in step 610 that the number of verify fails is not more than the acceptable number of verify fails, then the process transitions to step 612. Alternatively, if it is determined in step 610 that the number of verify fails is more than, i.e., exceeds, the acceptable number, then the process transitions to step 614.

In step 612 (S612), such information is stored in a register of a pseudo-pass information storage 7 that indicates the verify operation being passed by way of the pseudo-pass. The stored information is configured so as to read, and determine, by way of known status read commands, whether the pseudo-pass results in success or not. Upon completion of step 612, the process transitions to step 618.

In step 614 (S614), a determination is made as to whether the number of write operations or the time of write operation exceeds the preset maximum number of write operations or the preset longest time of write operation. Specifically, the maximum number of write operations or the longest time of write operation is, for example, preset and stored in advance in the NAND-type flash memory according to this embodiment. These determinations are made by the comparison between the preset maximum number of write operations or the preset longest time of write operation and the actual number of write operations or the actual time of write operation. Besides, although not depicted in the drawing, the NAND-type flash memory according to this embodiment is provided with a counter for measuring the actual number of write operations or a timer for measuring the actual time of write operation. That counter or timer initiates and performs measurement of the number of write operations or the time of write operation.

If it is determined in step 614 that the actual number of write operations measured exceeds the preset maximum number of write operations or the actual time of write operation measured exceeds the preset longest time of write operation, then the process transitions to step 616. Alternatively, if it is determined in step 614 that the actual number of write operations measured does not exceed the preset maximum number of write operations or the actual time of write operation measured does not exceed the preset longest time of write operation, then the process transitions to step 504 and the information write operation is performed again.

In step 616 (S616), it is determined that the write operation fails for the page data in question and the FAIL information that indicates the failed write operation for the page data is stored in a register of the NAND-type flash memory (FAIL information storage). In this way, the write operation is performed. Upon completion of step 616, the process transitions to step 618.

In step 618 (S618), a determination is made as to whether the status read is "PASS". Specifically, the FAIL information stored in step 616 may be read, e.g., using a status read command. Thus, if the obtained result is "PASS" in step 604, and after the completion of step 612 or 616, then a status read command is sent to the NAND-type flash memory from a control device provided external to the NAND-type flash memory. Upon receipt of the command, the NAND-type flash memory returns it to the control device to convey such information that indicates the completion of the write operation at the NAND-type flash memory.

If the obtained result is "PASS" in step 618, then the write verify operation in the third page terminates. Alternatively, if the obtained result is "FAIL" in step 618, then the process transitions to step 620.

In step 620 (S620), defect correction is performed. Specifically, the page data determined as "FAIL" is rewritten with another page. Then, necessary operations are performed wherein the page determined as "FAIL" is processed as a defected page or a defected block, for example. Upon completion of step 620, the write verify operation in the third page terminates. Besides, the operations of steps 502 through 616 are performed at the NAND-type flash memory 51 illustrated in FIG. 8, while the operations of steps 618 and 620 are performed at the flash controller 53 as a memory controller illustrated in FIG. 8. Further, in this embodiment, some or all of the steps of the verify skip operation may be omitted, which may further accelerate the operation.

Sixth Embodiment

A sixth embodiment will now be described below. The third embodiment has pseudo-pass settings fixed to zero for the data "2" in the corresponding memory cell of the second page as well as for the data "1L", "2L" and "3L" in the corresponding memory cell of the third page of the fifth embodiment. Thus, only the complete PASS is permitted for the data "2" in the corresponding memory cell of the second page as well as for the data "1L", "2L" and "3L" in the corresponding memory cell of the third page. In this case, principles similar to those in the third embodiment are applied to the third page. This allows registers to be omitted that is used to store pseudo-pass information for the data "2" in the corresponding memory cell of the second page as well as for the data "1L", "2L" and "3L" in the corresponding memory cell of the third page, which may mitigate circuit loads.

Figure 24:
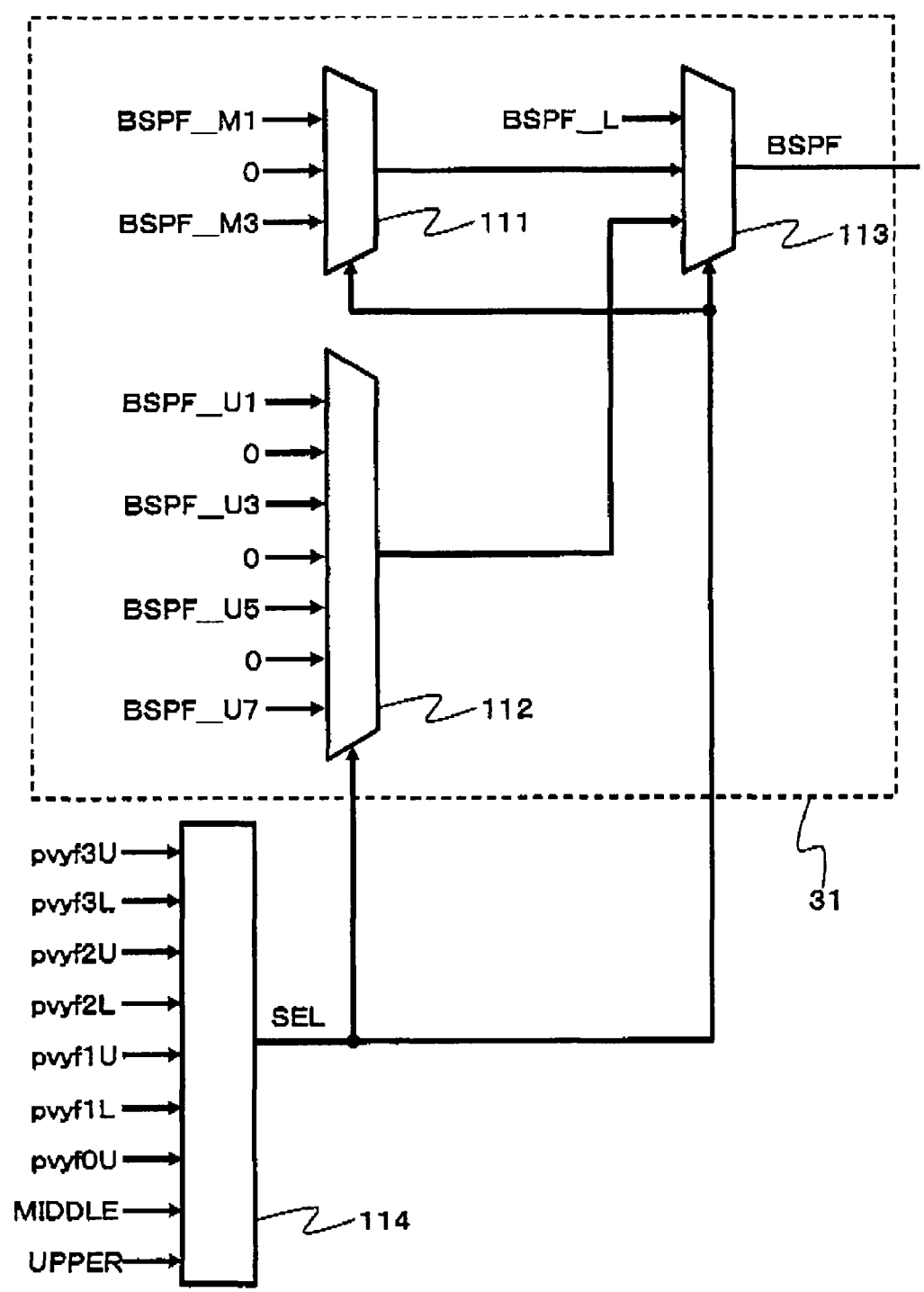
FIG. 24 is a configuration diagram for selection of register output signals according to the sixth embodiment.

In explanation of this embodiment based on FIGS. 23 and 24, the first page, it is assumed that register output signals corresponding to the data "1" and "3" in the corresponding memory cell of the second page, as well as register output signals corresponding to the data "0U", "1U", "2U" and "3U" in the corresponding memory cell of the third page, are similar to those in the fifth embodiment and input to the first selection circuit 111. It is also assumed that register output signals corresponding to the data "2" in the corresponding memory cell of the second page, as well as register output signals corresponding to the data "1L", "2L" and "3L" in the corresponding memory cell of the third page, are set to "0" and input to the second selection circuit 112. Thus, the number of pseudo-pass setting for the data "2" in the corresponding memory cell of the second page, as well as for the data "1L", "2L" and "3L" in the corresponding memory cell of the third page, is set to "0". Similar to the fifth embodiment, a register output signal is selected by the selection-signal generation circuit 114 and it is output from the third selection circuit 113.

Seventh Embodiment

Figure 25:
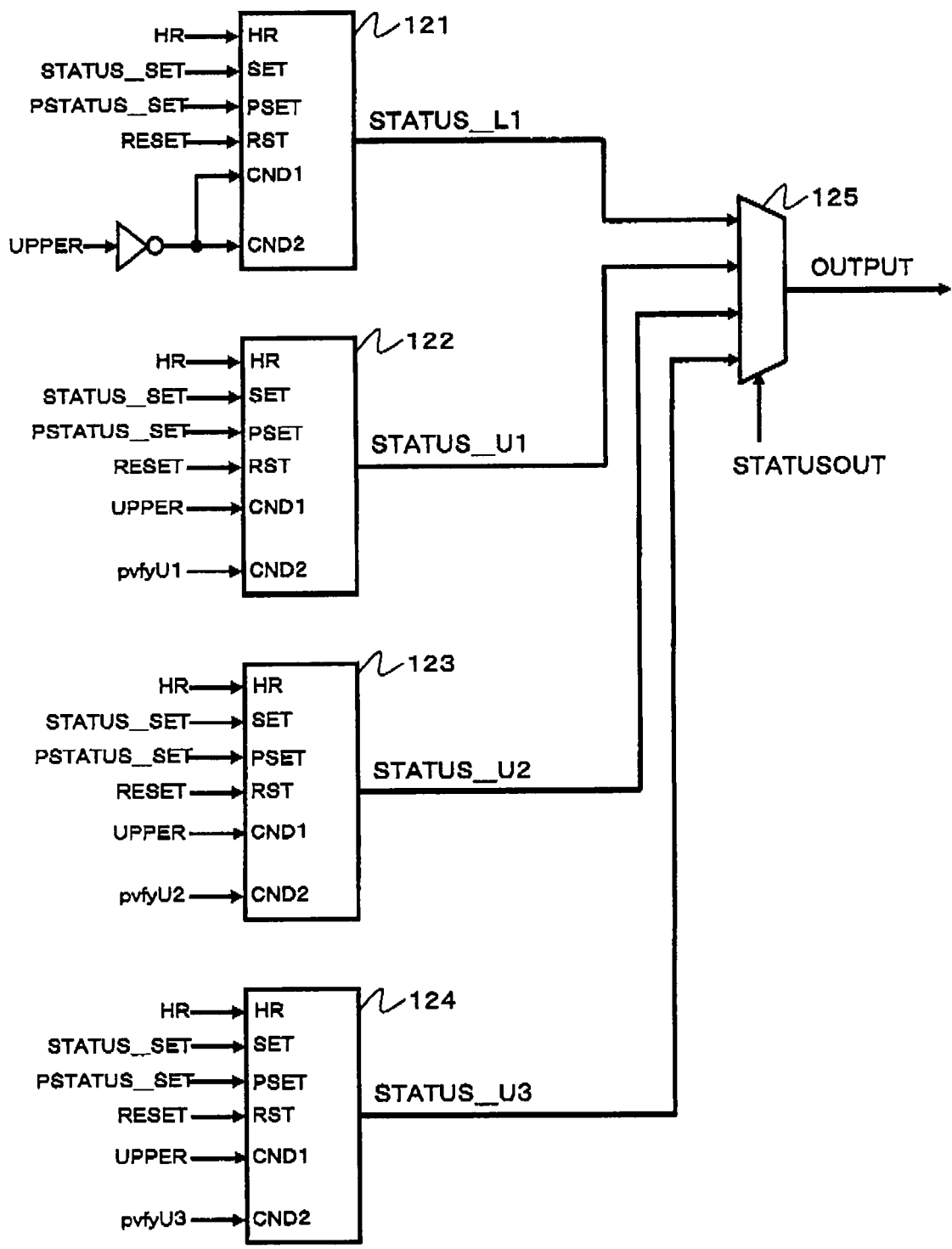
FIG. 25 is a configuration diagram of a status register according to a seventh embodiment.

A seventh embodiment will now be described below. In the seventh embodiment, pseudo-pass information and result information for failure measurements in a page are stored to a different register. FIG. 25 is a configuration diagram of a status register according to this embodiment. Based on FIG. 25, a semiconductor storage device corresponding to the first embodiment will be described below.

The semiconductor storage device according to this embodiment comprises; a write status register 121 for the first page; a write status register 122 for data "1" in the second page; a write status register 123 for data "2" in the second page; a write status register 124 for data "3" in the second page; and a selector circuit 125. The status registers 121, 122, 123 and 124 are initialized by inputting respective signals to respective RESET terminals. In addition, in a write operation for each page, the status registers 121, 122, 123 and 124 are identified by bringing respective terminals of pvfy1U, pvfy2U, pvfy3U and UPPER into states of predetermined potential.

Besides, HRs are respective outputs of the verify-judge circuit of FIG. 10 that correspond to the respective status registers 121, 122, 123 and 124. In addition, the status registers 121 is associated with the pseudo-pass information storage in step 112 of FIG. 11 and the FAIL information storage in step 116 of FIG. 11 in the first embodiment; the status registers 122 is associated with the pseudo-pass information storage 1 in step 216 of FIG. 13 and the FAIL information storage in step 246 of FIG. 13 in the first embodiment; the status registers 123 is associated with the pseudo-pass information storage 2 in step 230 of FIG. 13 and the FAIL information storage in step 246 of FIG. 13 in the first embodiment; and the status registers 124 is associated with the pseudo-pass information storage 3 in step 242 of FIG. 13 and the FAIL information storage in step 246 of FIG. 13 in the first embodiment.

In addition, the pseudo-pass information storage is controlled by STATUS_SET, while the FAIL information storage is controlled by PSTATUS_SET. In order to input status information, STATUS_SET is activated to register pseudo-pass information and complete-pass fail information. This allows information that is stored in each of the status registers 121, 122, 123 and 124 to store three states: "complete PASS", "pseudo-pass" and "FAIL".

The status register 121 stores status information in a different page than that stored in the status registers 122, 123 and 124. Thus, if it is not necessary to retain information of the first page and information of the second page at the same time, it may be possible to have a configuration where parts of the status registers are shared. In addition, the FAIL information needs only to be included for each page, and not need to be included in each of the status registers 121, 122, 123 and 124, and. Accordingly, only "pseudo-pass" may be registered in the status registers 121, 122, 123 and 124 and the FAIL information may be stored in an additional status register. The stored information may be selected and read by the selector circuit 125. Based on this information, a determination is made as to whether any error correction is needed or whether the error correction algorithm is to be changed.

In this way, storing three states, "complete PASS", "pseudo-pass" and "FAIL", for each page allows determination of any necessary error correction for each page or any necessary changes in error correction algorithm. Besides, this may correspond to the second to fourth embodiments in a similar manner.

Figure 26:
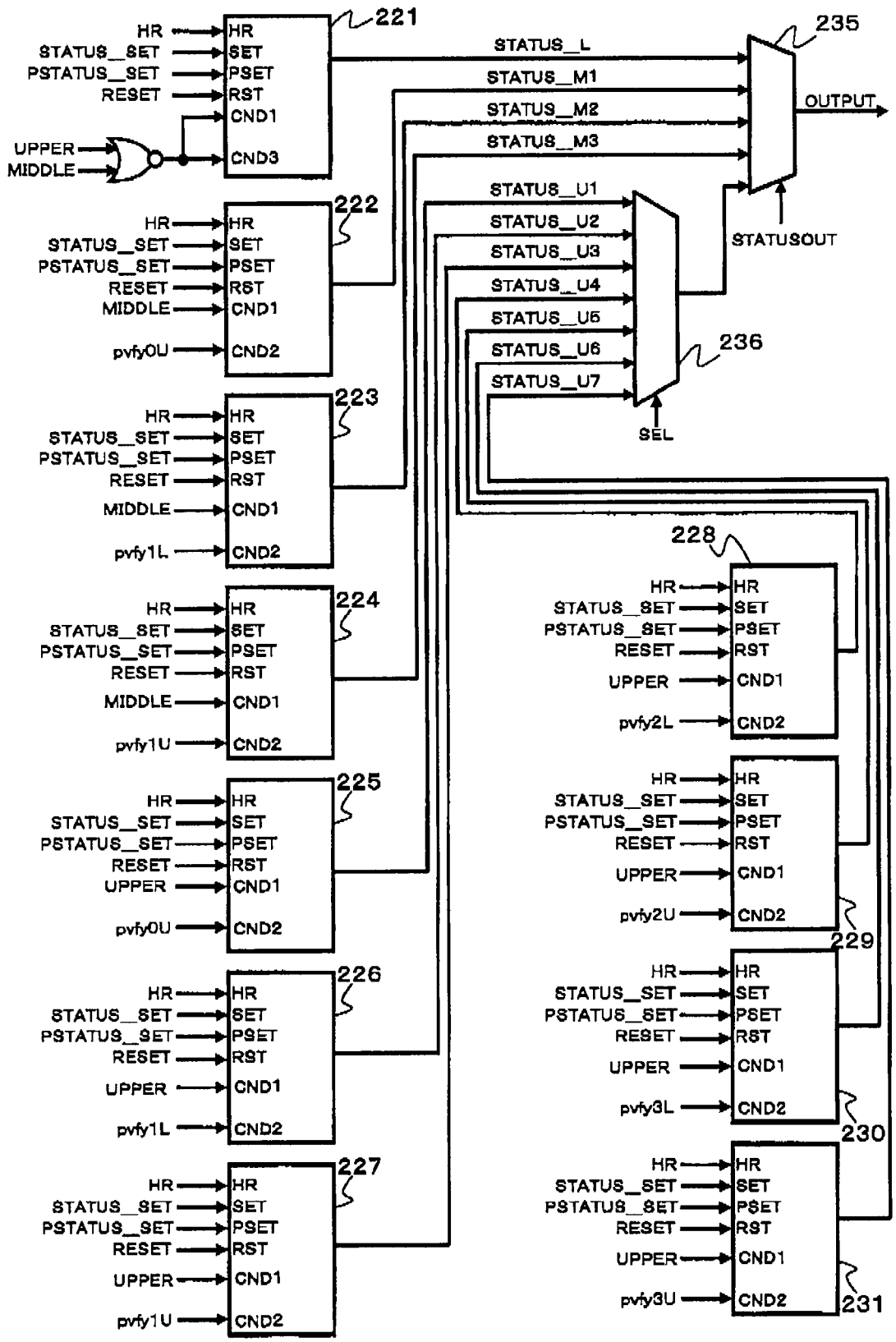
FIG. 26 is a configuration diagram of another status register according to the seventh embodiment.

In addition, FIG. 26 is a configuration diagram of a status register that stores 3 bits in one memory cell according to this embodiment. Based on FIG. 26, a semiconductor storage device corresponding to the fifth embodiment will be described below.

The semiconductor storage device of FIG. 26 comprises: a write status register 221 for the first page; a write status register 222 for data "1" in the second page; a write status register 223 for data "2" in the second page; a write status register 224 for data "3" in the second page; a write status register 225 for data "1" in the third page; a write status register 226 for data "2" in the third page; a write status register 227 for data "3" in the third page; a write status register 228 for data "4" in the third page; a write status register 229 for data "5" in the third page; a write status register 230 for data "6" in the third page; a write status register 231 for data "7" in the third page; and selector circuits 235 and 236. Connected to an input of selector circuit 235 are outputs of the status registers 221, 222, 223 and 224 and an output of the selector circuit 236. In addition, connected to an input of the selector circuit 236 are outputs of the status registers 225, 226, 227, 228, 229, 230 and 231. The status registers 221, 222, 223, 224, 225, 226, 227, 228, 229, 230 and 231 are initialized by inputting respective signals to respective RESET terminals. In addition, in writing the third page, the status register 225, 226, 227, 228, 229, 230 and 231 are identified by bringing respective signals, which are input to pvfy0U, pvfy1L, pvfy1U, pvfy2L, pvfy2U, pvfy3L, pvfy3U and UPPER, into states of predetermined potential.

Besides, the status register 225 is associated with the pseudo-pass information storage 1 in step 528 of FIG. 20 and the FAIL information storage in step 616 of FIG. 20 in the fifth embodiment; the status register 226 is associated with the pseudo-pass information storage 2 in step 542 of FIG. 20 and the FAIL information storage in step 616 of FIG. 20 in the fifth embodiment; the status register 227 is associated with the pseudo-pass information storage 3 in step 556 of FIG. 20 and the FAIL information storage in step 616 of FIG. 20 in the fifth embodiment; the status register 228 is associated with the pseudo-pass information storage 4 in step 570 of FIG. 20 and the FAIL information storage in step 616 of FIG. 20 in the fifth embodiment; the status register 229 is associated with the pseudo-pass information storage 5 in step 584 of FIG. 20 and the FAIL information storage in step 616 of FIG. 20 in the fifth embodiment; the status register 230 is associated with the pseudo-pass information storage 6 in step 598 of FIG. 20 and the FAIL information storage in step 616 of FIG. 20 in the fifth embodiment; and the status register 231 is associated with the pseudo-pass information storage 7 in step 612 of FIG. 20 and the FAIL information storage in step 616 of FIG. 20 in the fifth embodiment.

Eighth Embodiment

An eighth embodiment will now be described below. The NAND-type flash memory of the semiconductor storage device according to this embodiment is, substantially similar to the first embodiment, a multi-value storage memory that may store 2 bits in one memory cell. As such, the following description is made with reference to FIGS. 1 to 10 as deemed appropriate. However, the eighth embodiment differs from the above-mentioned embodiments in that write operations are completed for all information in a plurality of pages (in the case of four-value storing operation, for two pages) before respective verify operations for each page are sequentially performed. Thus, the signal UPPER described in conjunction with FIG. 12 is not required and may be omitted here.

Figure 27:
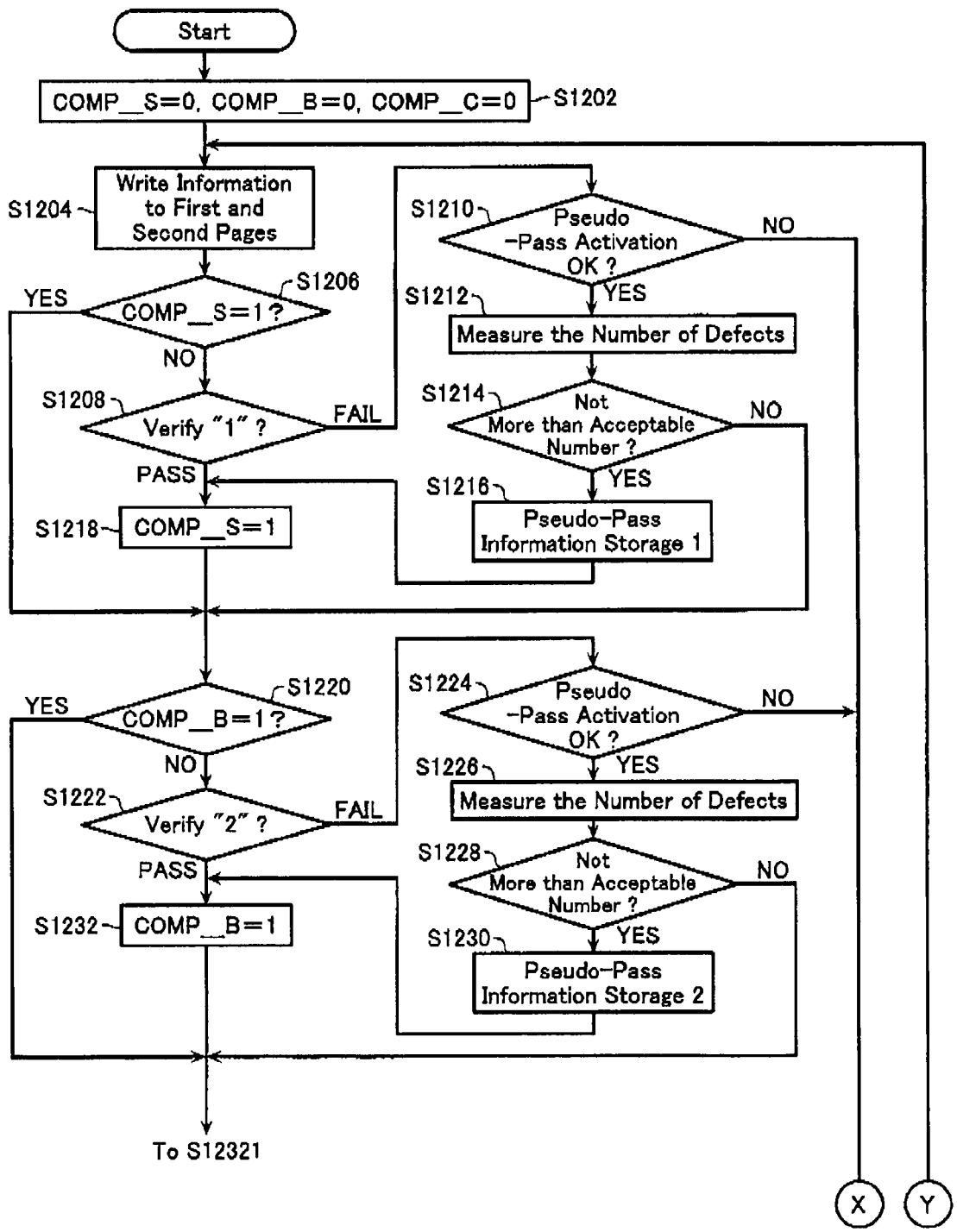
FIG. 27 is a flowchart illustrating a write operation according to an eighth embodiment.
Figure 28:
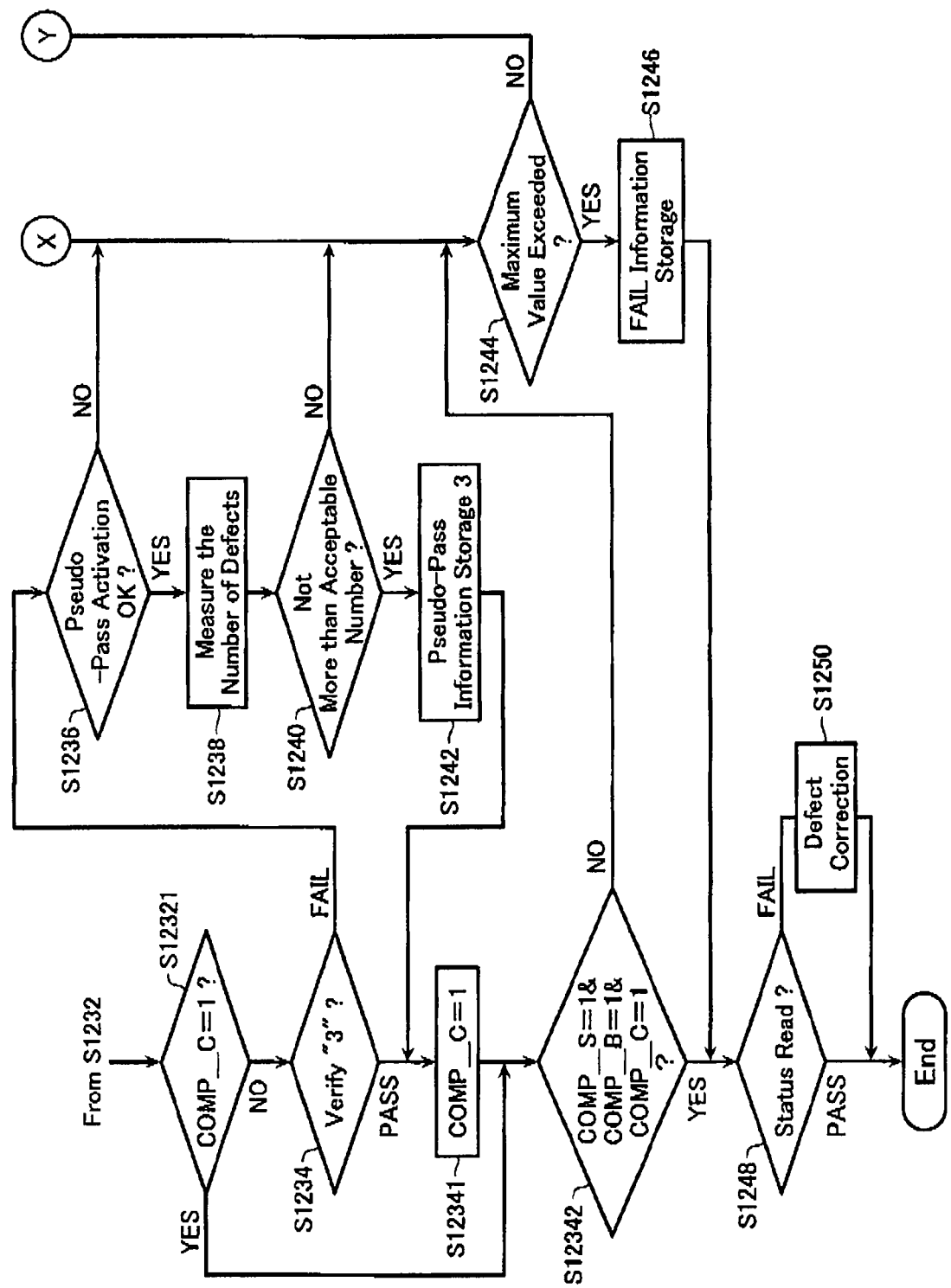
FIG. 28 is a flowchart illustrating a write operation according to an eighth embodiment.

A write verify operation according to this embodiment will now be described below based on FIG. 27 and FIG. 28.

Beginning in step 1202 (S1202), verification flags COMP_S, COMP_B and COMP_C are initialized in the register 20 of FIG. 1. Each of these signals indicates whether a verify read operation needs to be carried out on data in the corresponding memory cell. In this embodiment, COMP_S, COMP_B and COMP_C are all set to "0". In this embodiment, COMP_S may be assigned as a signal that identifies a verify complete pass to data "1" in the corresponding memory cell or that identifies the acceptable number of pseudo-passes not being exceeded, COMP_B may be assigned as a signal that identifies a verify complete pass to data "2" in the corresponding memory cell or that identifies the acceptable number of pseudo-passes not being exceeded, and COMP_C may be assigned as a signal that identifies a verify complete pass to data "3" in the corresponding memory cell or that identifies the acceptable number of pseudo-passes not being exceeded.

Then, in step 1204 (S1204), information is written to the first and second pages based on the above-mentioned method. Specifically, write pluses are applied to a memory cell depending on the information to be written and a write operation is performed thereto. Once the information being written, the application of voltage is terminated. Upon completion of step 1204, the process transitions to step 1206.

In step 1206 (S1206), a determination is made as to whether COMP_S is "1". If it is determined in step 1206 that COMP_S is "1", then the process transitions to step 1220. Alternatively, if it is determined in step 1206 that COMP_S is not "1", i.e., if COMP_S is determined to be "0", then the process transitions to step 1208.

In step 1208 (S1208), a verify read operation is performed at write level for the data "1" in the corresponding memory cell of the second page. Then, a determination is made as to whether the data "1" in all corresponding memory cells proves to be "PASS". Specifically, as illustrated in FIG. 7C, let "a'" be the potential of the word line (WL), a verify read is performed. As a result, if it is determined in step 1208 that the data "1" in all corresponding memory cells proves to be "PASS", i.e., if they are determined to store data in normal state, then the process transitions to step 1218. In step 1208, if one or more of the memory cells are detected that do not store information in normal state, then those memory cells prove to be "FAIL" and the process transitions to step 1210.

In step 1210 (S1210), a determination is made as to whether the pseudo-pass activation is "OK" for the data "1". The number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". It is not necessary to perform a pseudo-pass operation when the acceptable number of pseudo-passes is zero. Thus, this method may be combined with other methods wherein the pseudo-pass activation is, by compulsion, determined to be not "OK". If it is determined in step 1210 that the pseudo-pass activation is "OK", then the process transitions to step 1212. Alternatively, if it is determined in step 210 that the pseudo-pass activation is "NO", then the process transitions to step 1244.

In step 1212 (S1212), the number of verify fails, i.e., the number of defects, is measured for data "1". Upon completion of step 1212, the process transitions to step 1214.

In step 1214 (S1214), a determination is made as to whether the number of verify fails measured in step 1212 is not more than the acceptable number of verify fails.

If it is determined in step 1214 that the number of verify fails is not more than the acceptable number of verify fails, then the process transitions to step 1216. Alternatively, if it is determined in step 1214 that the number of verify fails is more than, i.e., exceeds, the acceptable number, then the process transitions to step 1220.

In step 1216 (S1216), such information is stored in a register of the pseudo-pass information storage 1 that indicates the verify operation being passed by way of the pseudo-pass for data "1". The stored information is configured so as to read, and determine, by way of known status read commands, whether the pseudo-pass results in success or not. Upon completion of step 1216, the process transitions to step 1218.

Instep 1218 (S1218), as the data "1" in the corresponding memory cell being complete "PASS" or the number of verify fails not more than the acceptable number of verify fails in the verify operation, no verify read operation is required from then on for the data "1" in the corresponding memory cell. Thus, the value of COMP_S is changed to "1". Upon completion of step 1218, the process transitions to step 1220.

In step 1220 (S1220), a determination is made as to whether COMP_B is "1". If it is determined in step 1220 that COMP_B is "1", then the process transitions to step 12321. Alternatively, if it is determined in step 1220 that COMP_B is not "1", i.e., if COMP_B is determined to be "0", then the process transitions to step 1222.

In step 1222 (S1222), a verify read operation is performed at write level for the data "2" in the corresponding memory cell of the second page. Then a determination is made as to whether the data "2" in all corresponding memory cells proves to be "PASS". As a result, if it is determined in step 1222 that the data "2" in all corresponding memory cells proves to be "PASS", i.e., if they are determined to store data in normal state, then the process transitions to step 1232. In step 1222, if one or more of the memory cells are detected that do not store information in normal state, then those memory cells prove to be "FAIL" and the process transitions to step 1224.

In step 1224 (S1224), a determination is made as to whether the pseudo-pass activation is "OK" for the data "2". Specifically, the amount of threshold-voltage shift is expected to be small at the beginning of the write operation to a memory cell in a page, and so is the number of memory cells that reach their verify levels to complete their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". If the acceptable number of pseudo-passes is zero, no pseudo-pass operation is required. Thus, this method may be combined with other methods wherein the pseudo-pass activation is determined, by compulsion, to be not "OK". If it is determined in step 1224 that the pseudo-pass activation is "OK", then the process transitions to step 1226. Alternatively, if it is determined in step 1224 that the pseudo-pass activation is "NO", then the process transitions to step 1244.

In step 1226 (S1226), the number of verify fails, i.e., the number of defects, is measured for data "2". Upon completion of step 1226, the process transitions to step 1228.

In step 1228 (S1228), a determination is made as to whether the number of verify fails measured in step 1226 is not more than the acceptable number of verify fails. In this case, the acceptable number of verify fails to be set is defined by a reference current Iref as illustrated in FIG. 10. If it is determined in step 1228 that the number of verity fails is not more than the acceptable number of verify fails, then the process transitions to step 1230. Alternatively, if it is determined in step 1228 that the number of verify fails is more than, i.e., exceeds, the acceptable number, then the process transitions to step 12321.

In step 1230 (S1230), such information is stored in a register of the pseudo-pass information storage 2 that indicates the verify operation being passed by way of the pseudo-pass for data "2". The stored information is configured so as to read, and determine, by way of known status read commands, whether the pseudo-pass results in success or not. Upon completion of step 1230, the process transitions to step 1232.

Instep 1232 (S1232), as the data "2" in the corresponding memory cell being complete "PASS" or the number of verify fails not more than the acceptable number of verify fails in the verify operation, no verify read operation is required from then on for the data "2" in the corresponding memory cell. Thus, the value of COMP_B is changed to "1". Upon completion of step 1232, the process transitions to step 12321.

In step 12321 (S12321), a determination is made as to whether COMP_C is "1". If it is determined in step 12321 that COMP_C is "1", then the process transitions to step 12341. Alternatively, if it is determined in step 12321 that COMP_C is not "1", i.e., if COMP_C is determined to be "0", then the process transitions to step 1234.

In step 1234 (S1234), a verify read operation is performed at write level for the data "3" in the corresponding memory cell of the second page. Then, a determination is made as to whether the data "3" in all corresponding memory cells proves to be "PASS". Specifically, as illustrated in FIG. 7C, let "c'" be the potential of the word line (WL), a verify read is performed. As a result, if it is determined in step 1234 that the data "3" in all corresponding memory cells proves to be "PASS", i.e., if they are determined to store data in normal state, then the process transitions to step 12341. In step 1234, if one or more of the memory cells are detected that do not store information in normal state, then those memory cells prove to be "FAIL" and the process transitions to step 1236.

In step 1236 (S1236), a determination is made as to whether the pseudo-pass activation is "OK" for the data "3". Specifically, the amount of threshold-voltage shift is expected to be small at the beginning of the write operation to a memory cell in a page, and so is the number of memory cells that reach their verify levels to complete their write operations. Accordingly, the number of write pulses applied to the corresponding memory cell is measured by a counter or the like. If the number of write pulses applied is not more than a predetermined value that is set by known means, it is determined that the pseudo-pass activation is not "OK". If the number of write pulses applied is more than the predetermined value, it is determined that the pseudo-pass activation is "OK". If the acceptable number of pseudo-passes is zero, no pseudo-pass operation is required. Thus, this method may be combined with other methods wherein the pseudo-pass activation is determined, by compulsion, to be not "OK." If it is determined in step 1236 that the pseudo-pass activation is "OK", then the process transitions to step 1238. Alternatively, if it is determined in step 1236 that the pseudo-pass activation is "NO", then the process transitions to step 1244.

In step 1238 (S1238), the number of verify fails, i.e., the number of defects, is measured for data "3". Upon completion of step 1238, the process transitions to step 1240.

In step 1240 (S1240), a determination is made as to whether the number of verify fails measured in step 1238 is not more than the acceptable number of verify fails. In this case, the acceptable number of verify fails to be set is defined by a reference current Iref as illustrated in FIG. 10. Additionally, in step 1240, a total acceptable number of the verify-fails for data "1", "2", and "3" (a total acceptable number) may be determined in advance. Then, an acceptable number for data "3" may be a number obtained by subtracting the actual number of defects obtained in step 1212 and 1226 from the total acceptable number.

If it is determined in step 1240 that the number of verify fails is not more than the acceptable number of verify fails, then the process transitions to step 1242. Alternatively, if it is determined in step 1240 that the number of verify fails is more than, i.e., exceeds, the acceptable number, then the process transitions to step 1244.

In step 1242 (S1242), such information is stored in a register of the pseudo-pass information storage 3 that indicates the verify operation being passed by way of the pseudo-pass for data "3". The stored information is configured so as to read, and determine, by way of known status read commands, whether the pseudo-pass results in success or not. Upon completion of step 1242, the process transitions to step 12341.

In step 12341 (S12341), as the data "3" in the corresponding memory cell being complete "PASS" or the number of verify fails not more than the acceptable number of verify fails in the verify operation, no verify read operation is required from then on for the data "3" in the corresponding memory cell. Thus, the value of COMP_C is changed to "1". Upon completion of step 12341, the process transitions to step 12342.

In step 1244 (S1244), a determination is made as to whether the number of write operations or the time of write operation exceeds the preset maximum number of write operations or the preset longest time of write operation. Specifically, the maximum number of write operations or the longest time of write operation is, for example, preset and stored in advance in the NAND-type flash memory according to this embodiment. These determinations are made by the comparison between the preset maximum number of write operations or the preset longest time of write operation and the actual number of write operations or the actual time of write operation. Besides, although not depicted in the drawing, the NAND-type flash memory according to this embodiment is provided with a counter for measuring the actual number of write operations or a timer for measuring the actual time of write operation. That counter or timer initiates and performs measurement of the number of write operations or the time of write operation.

If it is determined in step 1244 that the actual number of write operations measured exceeds the preset maximum number of write operations or the actual time of write operation measured exceeds the preset longest time of write operation, then the process transitions to step 1246. Alternatively, if it is determined in step 1244 that the actual number of write operations measured does not exceed the preset maximum number of write operations or the actual time of write operation measured does not exceed the preset longest time of write operation, then the process transitions to step 1204 and the information write operation is performed again.

In step 1246 (S1246), it is determined that the write operation fails for the page data in question and the FAIL information that indicates the failed write operation for the page data is stored in a register of the NAND-type flash memory (FAIL information storage). In this way, the write operation is performed. Upon completion of step 1246, the process transitions to step 1248.

In step 12342 (S12321), a determination is made as to whether COMP_S=COMP_B=COMP_C="1". If it is determined in step 12321 that COMP_S=COMP_B=COMP_C="1", then the process transitions to step 1248. Alternatively, if it is determined in step 12342 that not all of COMP_S, COMP_B, and COMP_C are not "1", then the process transitions to step 1244.

In step 1248 (S1248), a determination is made as to whether the status read is "PASS". Specifically, the FAIL information stored in step 1246 may be read, e.g., using a status read command. Thus, if the obtained result is "PASS" in step 1234, and after the completion of step 1242 or 1246, then a status read command is sent to the NAND-type flash memory from a control device provided external to the NAND-type flash memory. Upon receipt of the command, the NAND-type flash memory returns it to the control device to convey such information that indicates the completion of the write operation at the NAND-type flash memory.

If the obtained result is "PASS" in step 1248, then the write verify operation in the second page terminates. Alternatively, if the obtained result is "FAIL" in step 1248, then the process transitions to step 1250.

In step 1250 (S1250), defect correction is performed. Specifically, the page data determined as "FAIL" is rewritten with another page. Then, necessary operations are performed wherein the page determined as "FAIL" is processed as a defected page or a defected block, for example. Upon completion of step 1250, the write verify operation terminates. Besides, the operations of steps 1202 through 1246 are performed at the NAND-type flash memory 51 illustrated in FIG. 8, while the operations of steps 1248 and 1250 are performed at the flash controller 53 as a memory controller illustrated in FIG. 8. Furthermore, in the eighth embodiment, a verify skip operation may be performed in a similar manner to the second embodiment.

The disclosed embodiments may be adapted to store information of two bits or more in one memory cell, and may specifically be applied to the storage of information of 4 or more bits without limitation to 2 or 3 bits.

Although the semiconductor storage device according to the present invention has been described in terms of several exemplary embodiments, the present invention is not limited to the specifically disclosed embodiments, and may take any other forms than those specifically described herein.

What is claimed is:

1. A semiconductor storage device comprising:
   a memory cell array with a plurality of multi-value memory cells arranged therein, the plurality of multi-value memory cells capable of storing information of two bits or more in one memory cell as a different page;
   a plurality of data registers temporarily retaining data read from the memory cell array;
   an acceptable-number setting register storing multiple acceptable numbers of data states corresponding to each state of threshold voltages of each page in the multi-value memory cells;
   a selector selecting, from the multiple acceptable numbers of data states, an acceptable number of data states for data retained in each of the data registers corresponding to each page of the multi-value memory cells; and
   a comparator comparing the number of data states retained in each of the data registers with the acceptable number of data states selected by the selector.

2. The semiconductor storage device according to claim 1, wherein a comparison is made by the comparator upon completion of voltage application for writing information in the memory cell array.

3. The semiconductor storage device according to claim 1, further comprising a selection-signal generator connected to the selector, wherein
   an acceptable number of data states is selected at the selector based on a selection signal generated by the selection-signal generator.

4. The semiconductor storage device according to claim 1, wherein the selector selects an acceptable number of data states corresponding to each state of threshold voltages of each of the pages.

5. The semiconductor storage device according to claim 4, further comprising a selection-signal generation circuit connected to the selector, wherein
   an acceptable number of data states is selected at the selector based on a selection signal generated by the selection-signal generator.

6. The semiconductor storage device according to claim 1, further comprising a reference-current setting unit setting a reference current according to the acceptable number of data states selected by the selector, wherein
   the comparator compares a fail current with the reference current, the fail current changing with data retained in each of the data registers.

7. The semiconductor storage device according to claim 1, wherein a comparison is made by the comparator upon completion of voltage application for writing information for all pages in the memory cell array.

8. The semiconductor storage device according to claim 1, wherein the comparator starts its operation when the number of times that a voltage applied to write information to the memory cell is equal to or greater than a predetermined number.

9. The semiconductor storage device according to claim 1, wherein the comparator outputs pseudo-pass information if the number of data states is smaller than the acceptable number of data states.

10. The semiconductor storage device according to claim 9, wherein the comparator outputs a signal for repeating write operations to the memory cell if the number of data states is larger than the acceptable number of data states.

11. The semiconductor storage device according to claim 1, further comprising a verify-judge circuit performing a verify judge for data read from the memory cell array and retained in each of the data registers.

12. The semiconductor storage device according to claim 11, wherein the verify-judge circuit starts its operation when the number of times that a voltage applied to write information to the memory cell is equal to or greater than a predetermined number.

13. The semiconductor storage device according to claim 11, wherein a comparison is made by the comparator upon completion of voltage application for writing information in the memory cell array.

14. The semiconductor storage device according to claim 11, further comprising a selection-signal generator connected to the selector, wherein
   an acceptable number of data states is selected at the selector based on a selection signal generated by the selection-signal generator.

15. The semiconductor storage device according to claim 11, further comprising a reference-current setting circuit setting a reference current according to the acceptable number of data states selected by the selector, wherein the comparator compares a fail current with the reference current, the fail current changing with data retained in each of the data registers.

16. The semiconductor storage device according to claim 11, wherein a comparison is made by the comparator upon completion of voltage application for writing information for all pages in the memory cell array.

17. The semiconductor storage device according to claim 11, wherein the comparator starts its operation when the number of times that a voltage applied to write information to the memory cell is equal to or greater than a predetermined number.

18. The semiconductor storage device according to claim 11, wherein the comparator outputs pseudo-pass information if the number of data states is smaller than the acceptable number of data states.

19. The semiconductor storage device according to claim 18, wherein the comparator outputs a signal for repeating write operations to the memory cell if the number of data states is larger than the acceptable number of data states.

20. The semiconductor storage device according to claim 1, further comprising a status register storing states of "complete pass", "pseudo-pass", and "fail" obtained for each of the pages.

* * * * *